US010818369B2

(12) United States Patent
Hiraga

(10) Patent No.: US 10,818,369 B2
(45) Date of Patent: Oct. 27, 2020

(54) SEMICONDUCTOR CIRCUIT, CONTROL METHOD OF SEMICONDUCTOR CIRCUIT, AND ELECTRONIC APPARATUS

(71) Applicant: SONY CORPORATION, Tokyo (JP)

(72) Inventor: Keizo Hiraga, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/336,815

(22) PCT Filed: Aug. 23, 2017

(86) PCT No.: PCT/JP2017/030087
§ 371 (c)(1),
(2) Date: Mar. 26, 2019

(87) PCT Pub. No.: WO2018/066246
PCT Pub. Date: Apr. 12, 2018

(65) Prior Publication Data
US 2019/0228829 A1    Jul. 25, 2019

(30) Foreign Application Priority Data

Oct. 3, 2016  (JP) ................................. 2016-195757

(51) Int. Cl.
*G11C 19/08* (2006.01)
*G11C 29/50* (2006.01)
(Continued)

(52) U.S. Cl.
CPC .............. *G11C 19/08* (2013.01); *G01R 31/28* (2013.01); *G01R 31/3177* (2013.01);
(Continued)

(58) Field of Classification Search
CPC ....... G11C 19/08; G11C 7/1006; G11C 14/00; G11C 19/28; G11C 29/50; G11C 29/52;
(Continued)

(56) References Cited

U.S. PATENT DOCUMENTS 5,912,937 A  *  6/1999 Goetting ............ G11C 16/0441
257/315
2004/0088630 A1    5/2004 Arima et al.
(Continued)

FOREIGN PATENT DOCUMENTS

JP    2004-126932    4/2004
JP    2012-242287    10/2012

OTHER PUBLICATIONS

Iyengar, A.S., et al., "MTJ-Based State Retentive Flip-Flop With Enhanced-Scan Capability to Sustain Sudden Power Failure", IEEE Transactions on Circuits and Systems I: Regular Papers vol. 62, Issue: 8, IEEE, Aug. 2015, pp. 2062-2068. (Year: 2015).*

(Continued)

*Primary Examiner* — Kyle Vallecillo
(74) *Attorney, Agent, or Firm* — Sheridan Ross P.C.

(57)    ABSTRACT

A semiconductor circuit of the disclosure includes: a sequential circuit unit including a plurality of logic circuit units that include respective flip flops and respective non-volatile storage elements, the sequential circuit unit performing, in a first term, store operation in which the storage elements in the plurality of the logic circuit units store respective voltage states in the plurality of the logic circuit units, and shift operation in which the flip flops in the plurality of the logic circuit units operate as a shift register; and a first memory that stores, in the first term, first data or second data, the first data being outputted from the shift register by the shift operation, and the second data corresponding to the first data.

21 Claims, 20 Drawing Sheets

(51) Int. Cl.

| | |
|---|---|
| *G01R 31/3177* | (2006.01) |
| *G06F 11/10* | (2006.01) |
| *G11C 29/52* | (2006.01) |
| *G11C 14/00* | (2006.01) |
| *G01R 31/28* | (2006.01) |
| *G06F 11/14* | (2006.01) |
| *G11C 7/10* | (2006.01) |
| *G11C 19/28* | (2006.01) |
| *H01L 27/04* | (2006.01) |
| *H01L 21/822* | (2006.01) |
| *H01F 10/32* | (2006.01) |
| *H01L 27/22* | (2006.01) |
| *H01L 43/02* | (2006.01) |

(52) U.S. Cl.
CPC ...... *G06F 11/1048* (2013.01); *G06F 11/1068* (2013.01); *G06F 11/14* (2013.01); *G11C 7/1006* (2013.01); *G11C 14/00* (2013.01); *G11C 19/28* (2013.01); *G11C 29/50* (2013.01); *G11C 29/52* (2013.01); *H01L 21/822* (2013.01); *H01L 27/04* (2013.01); *G11C 2029/5004* (2013.01); *H01F 10/329* (2013.01); *H01F 10/3286* (2013.01); *H01L 27/228* (2013.01); *H01L 43/02* (2013.01)

(58) Field of Classification Search
CPC ............ G11C 2029/5004; G01R 31/28; G01R 31/3177; G06F 11/1048; G06F 11/1068; G06F 11/14; H01L 21/822; H01L 27/04; H01L 27/228; H01L 43/02; H01F 10/3286; H01F 10/329
See application file for complete search history.

(56) References Cited

U.S. PATENT DOCUMENTS

| | | | | |
|---|---|---|---|---|
| 2006/0273823 | A1* | 12/2006 | Kamp | H03K 19/1776 326/41 |
| 2007/0061644 | A1* | 3/2007 | Birmiwal | G01R 31/318583 714/726 |
| 2007/0115150 | A1* | 5/2007 | Kanno | H03K 19/17758 341/50 |
| 2009/0063830 | A1* | 3/2009 | Ohnuki | G06F 11/3648 712/227 |
| 2014/0149773 | A1* | 5/2014 | Huang | G11C 13/0069 713/323 |
| 2014/0226781 | A1* | 8/2014 | Kurokawa | G11C 29/32 377/64 |

OTHER PUBLICATIONS

Suigbayashi et al., "Unified CMOS with MRAM: Nonvolatile magnetic flip flop experimental results and discussion," Japan Society of Applied Physics, Dec. 10, 2009, p. 5 [With English Translation].

Usami et al., "An MTJ-Based Flip-Flop Circuit to improved Robustness in Store/Restore Operations," Japan Society of Applied Physics, Mar. 3, 2016, p. 11-056 [With English Translation].

Suigbayashi et al., "MRAM Gijutsu tono Kino Yugo: Fukihatsu Jiki Flip-Flop no Shisaku to Kento," Dai 70 Kai Extended Abstracts, Japan Society of Applied Physics, Dec. 10, 2009, p. 55 [No Translation Available].

Usami et al., "Store/Restore Dosa no Robustness o Kojo saseta MTJ Riyo Fukihatsusei Flip-Flop Kairo," Dai 63 Kai JSAP Spring Meeting Koen Yokoshu, Japan Society of Applied Physics, Mar. 3, 2016, p. 11-056 [No Translation Available].

International Search Report prepared by the Japan Patent Office dated Sep. 12, 2017, for International Application No. PCT/JP2017/030087.

* cited by examiner

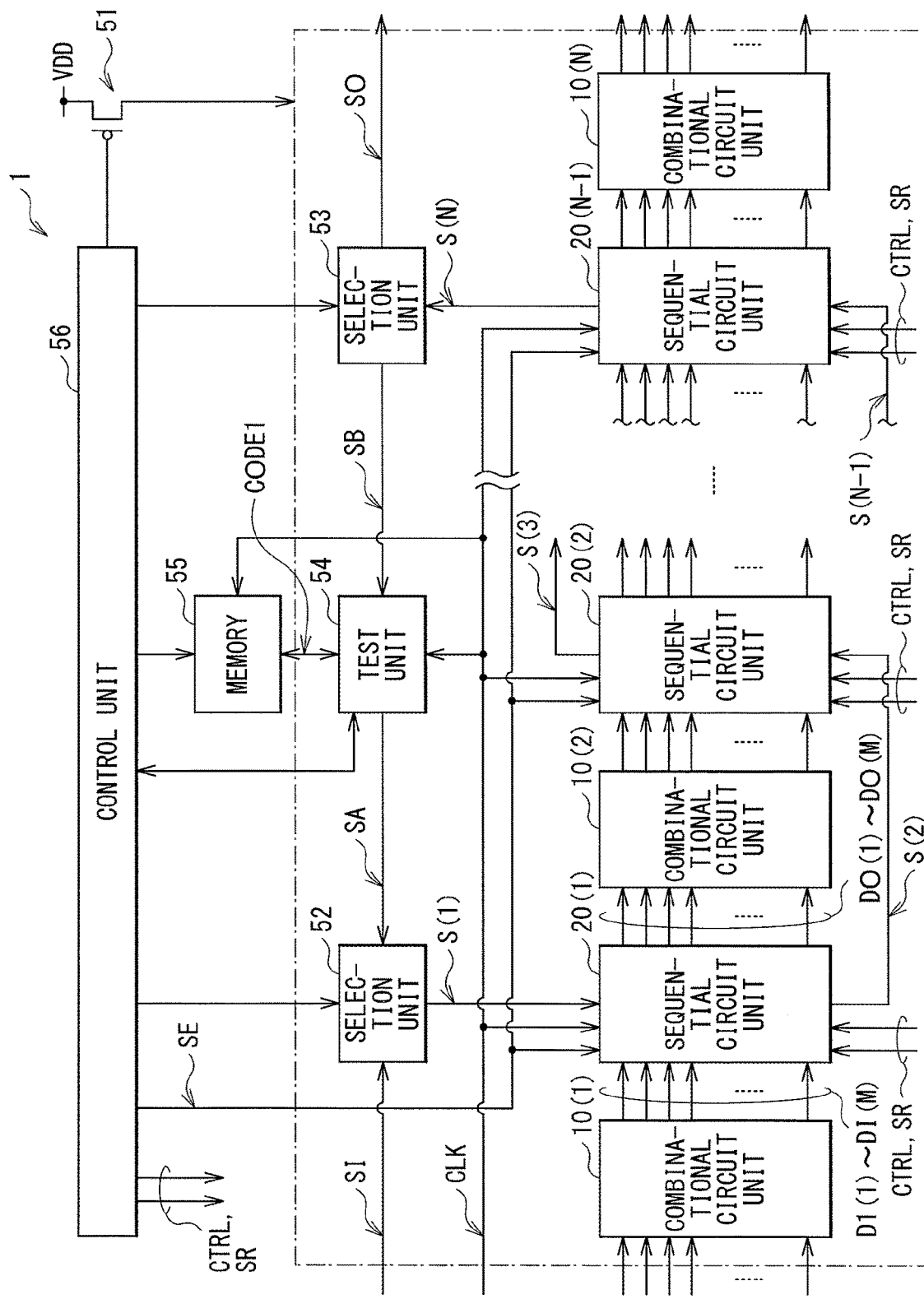
[FIG. 1]

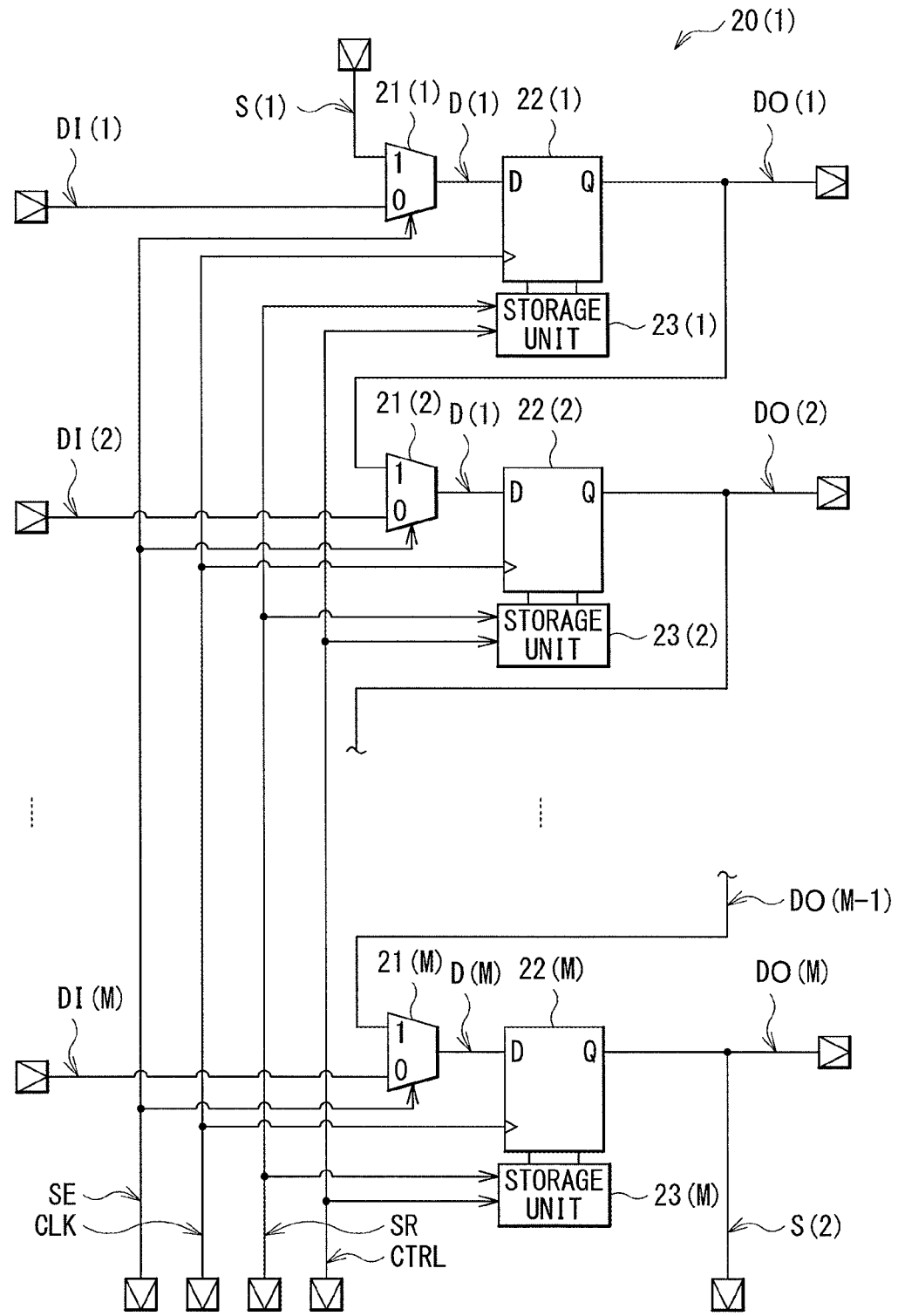
[FIG. 2]

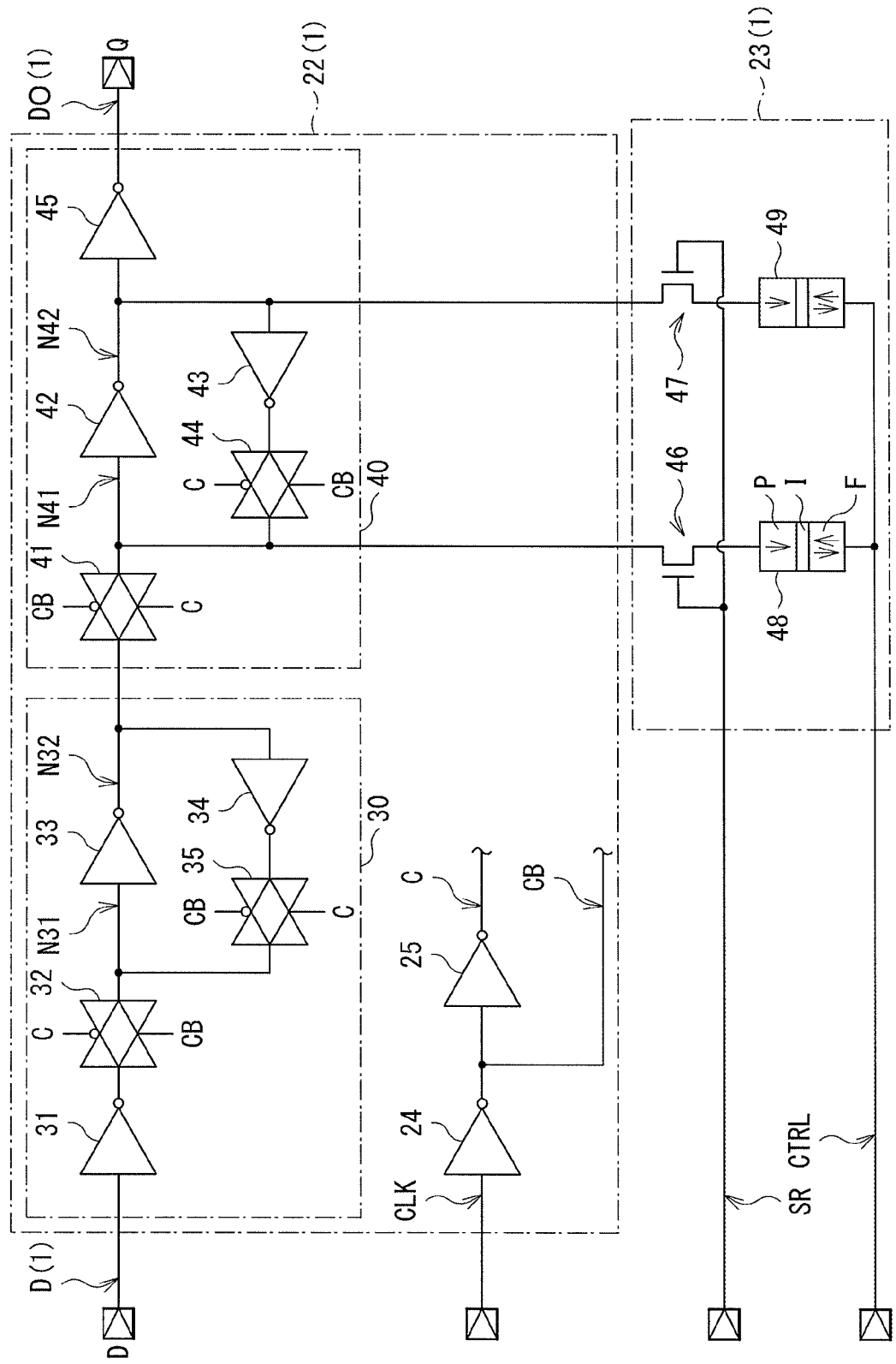
[FIG. 3]

[FIG. 4]
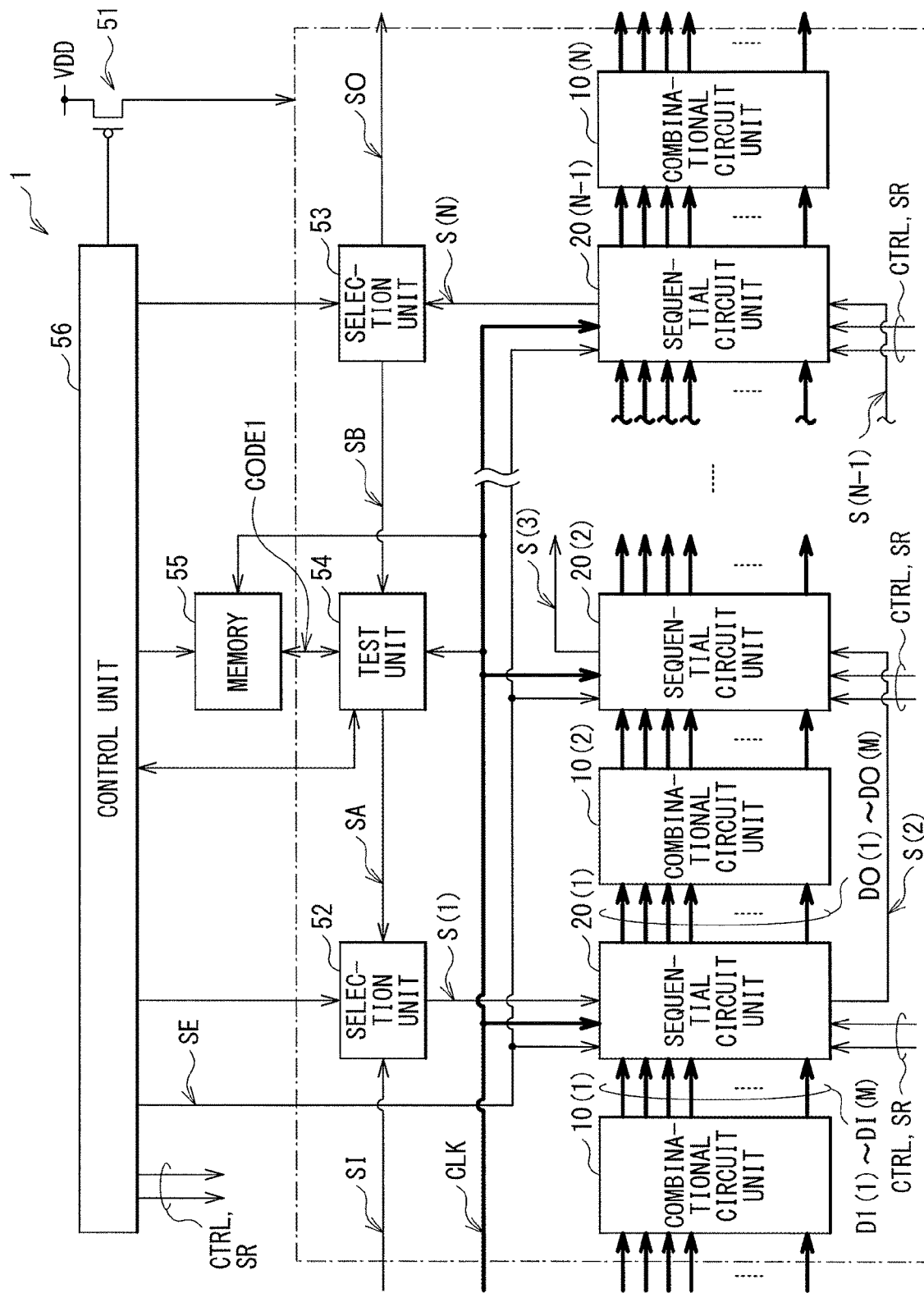

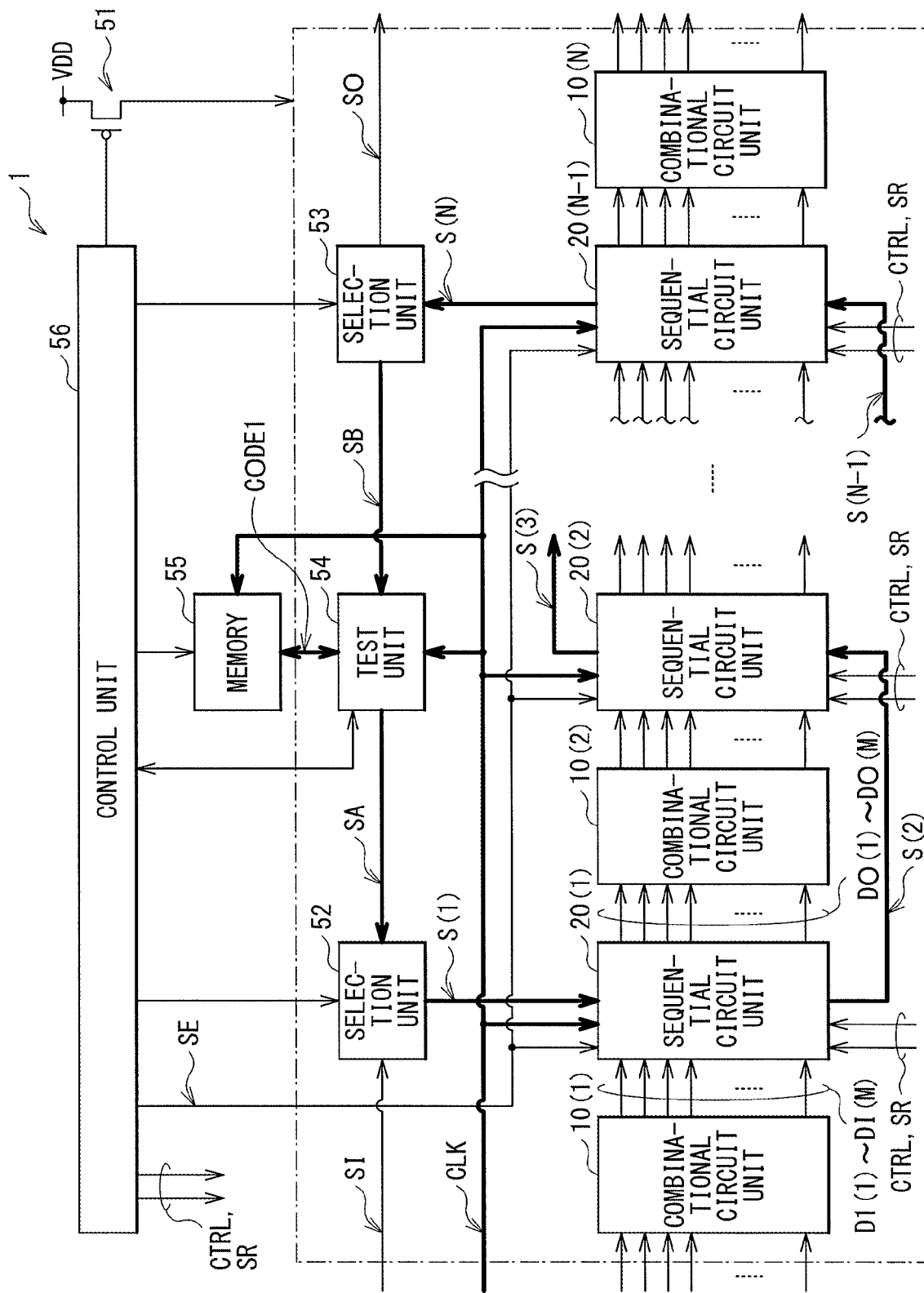

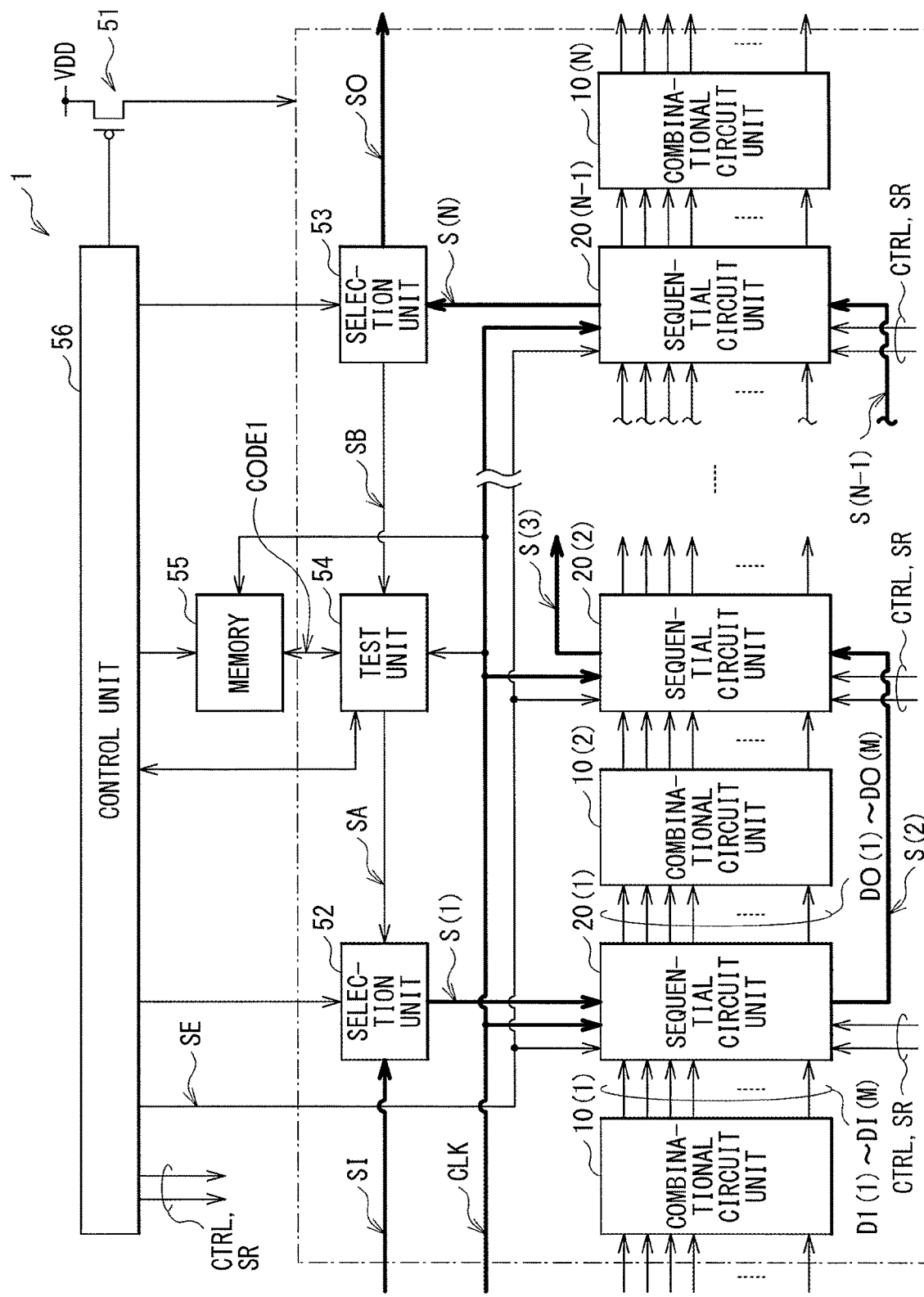
[FIG.6]

[ FIG. 7 ]
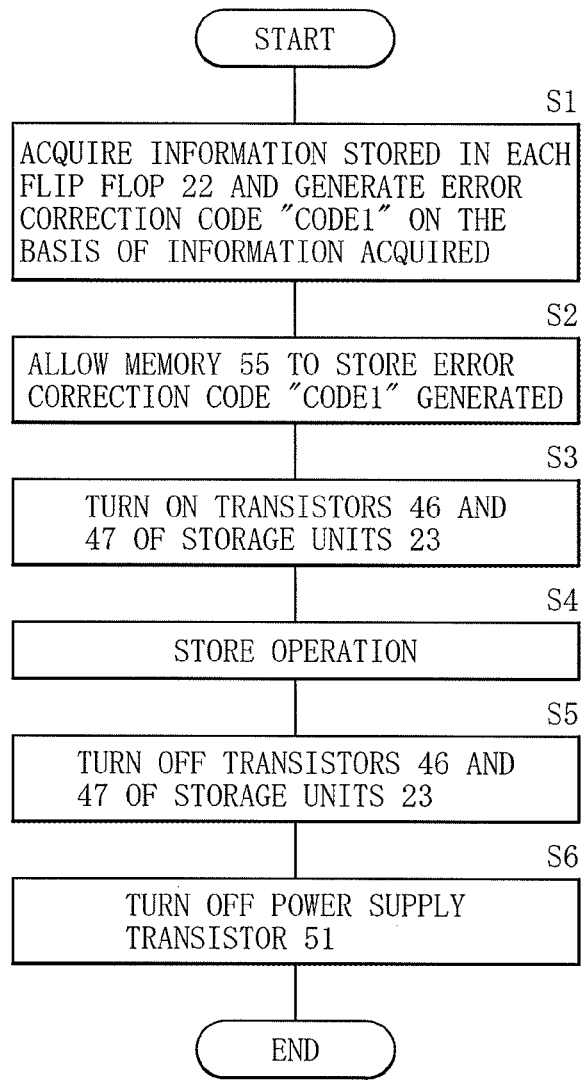

[ FIG. 8A ]
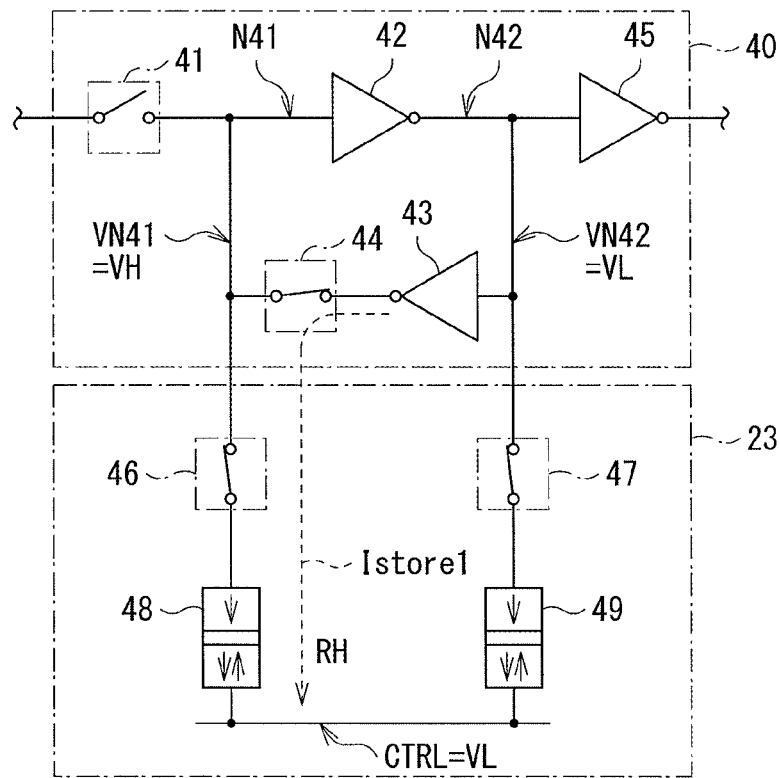
[ FIG. 8B ]
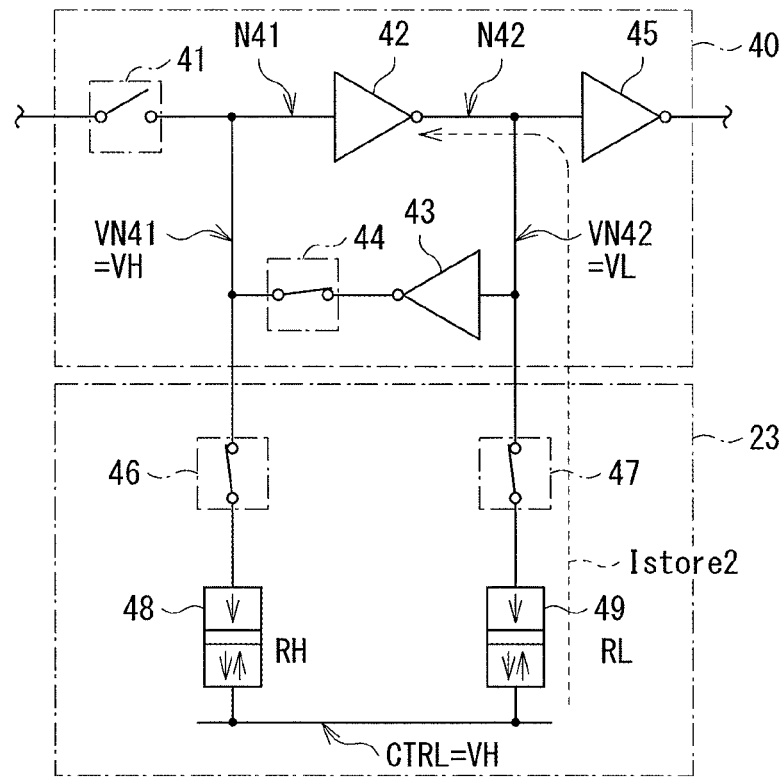

[ FIG. 9 ]
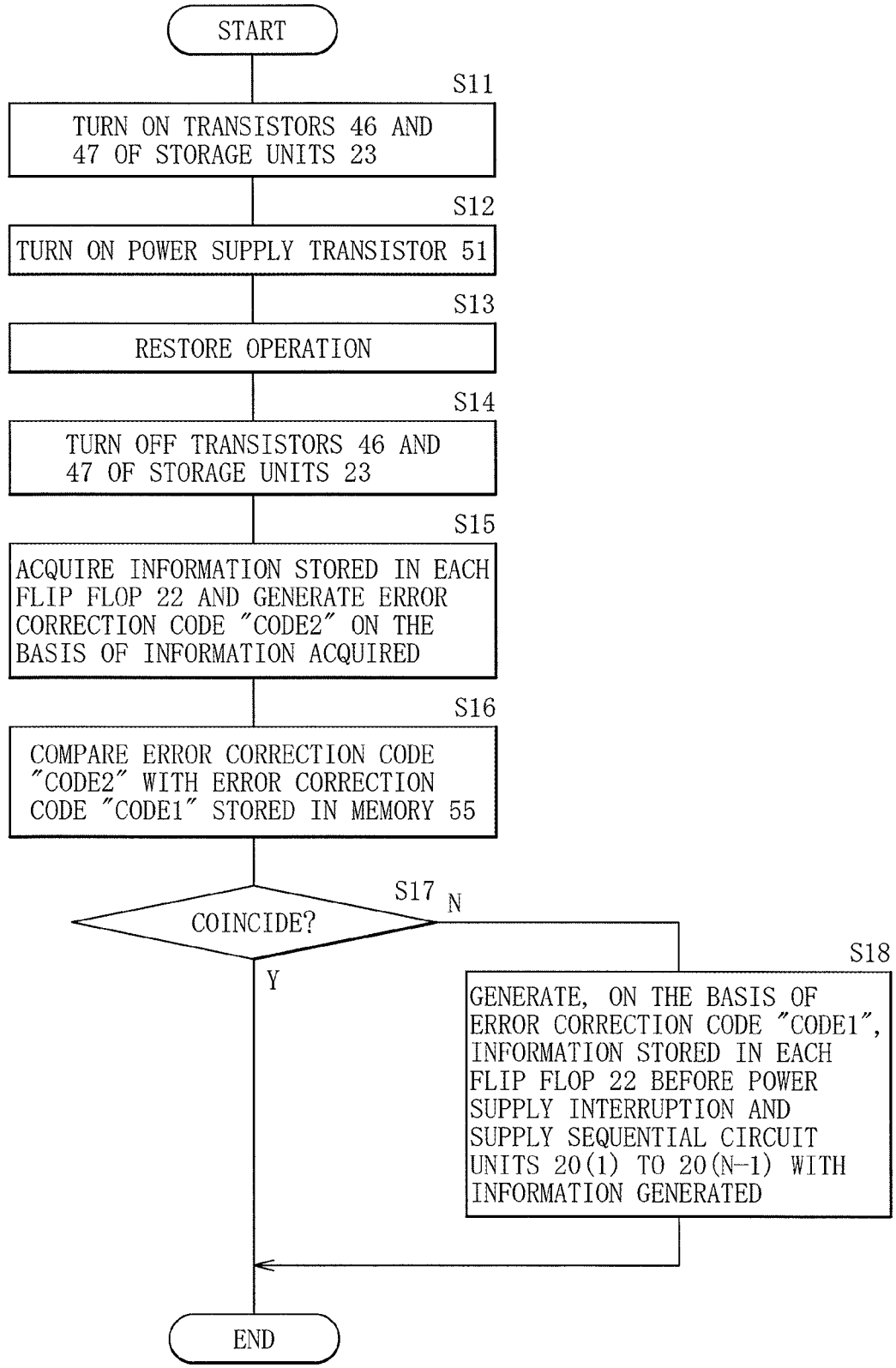

[ FIG. 10 ]
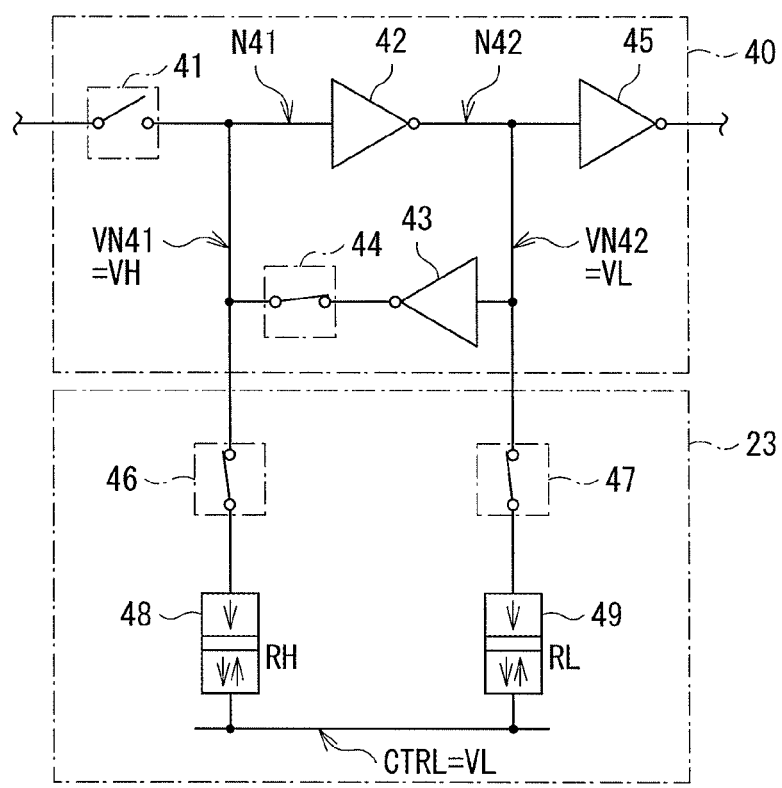

[FIG. 11]
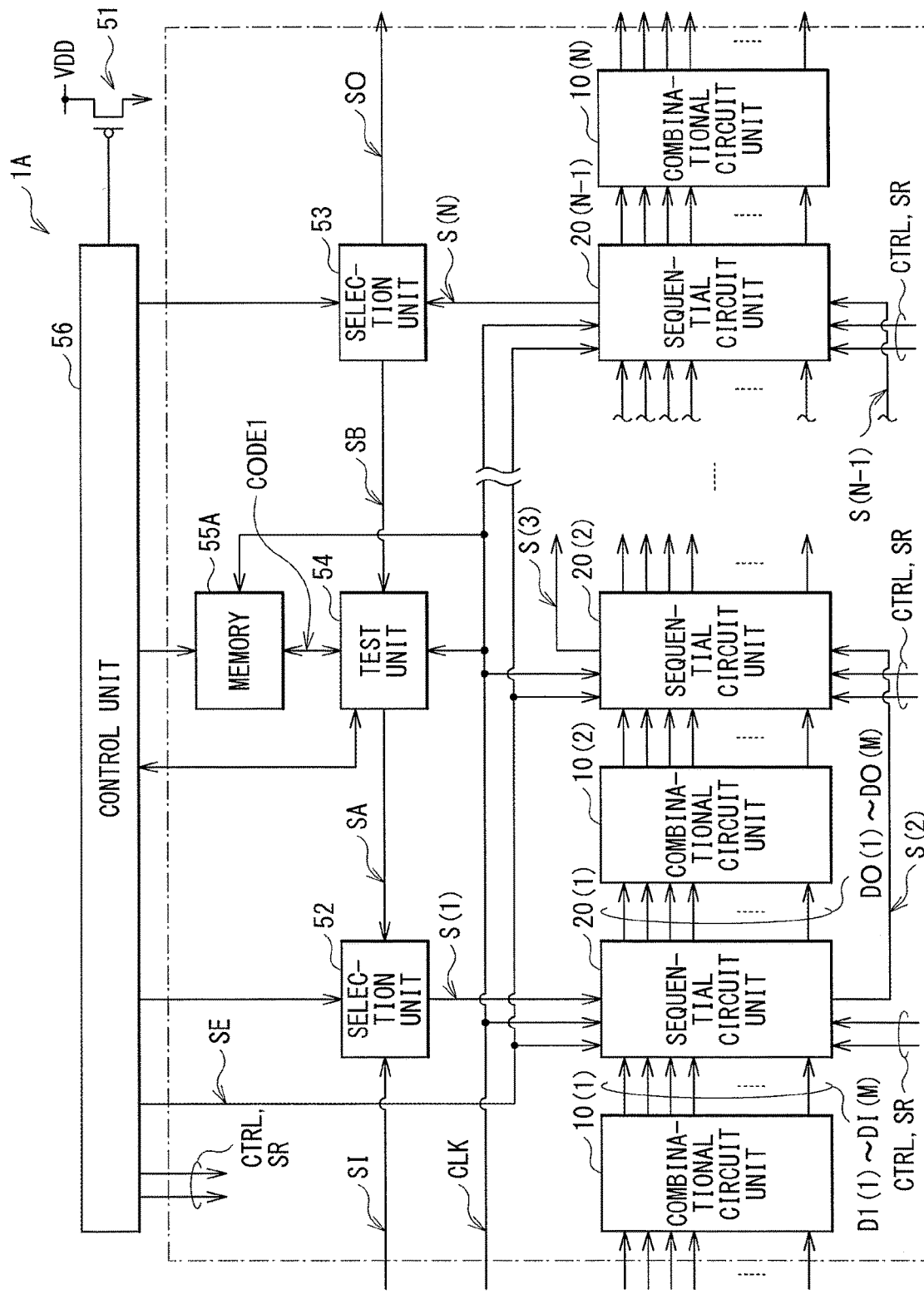

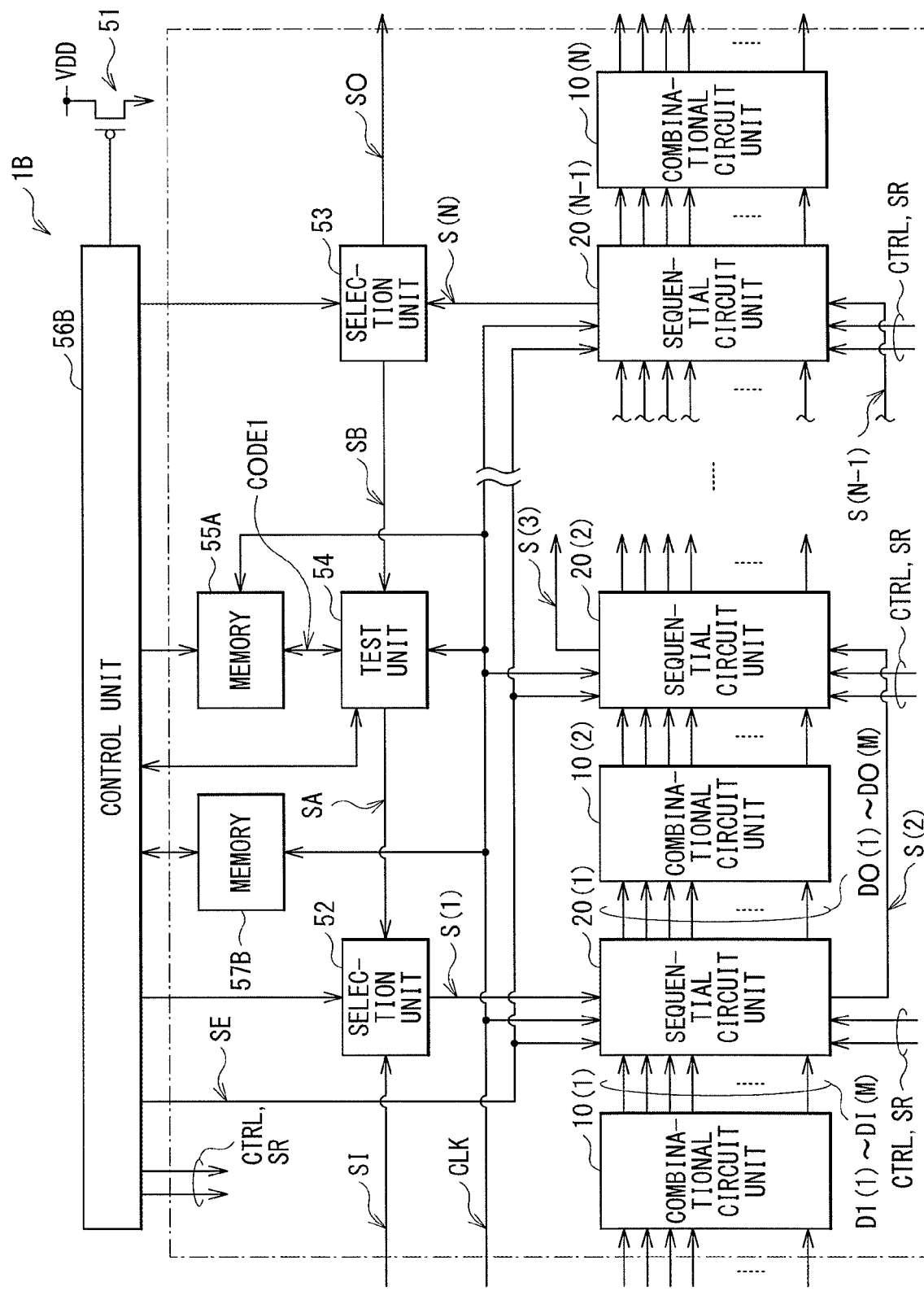
[FIG. 12]

[FIG. 13]
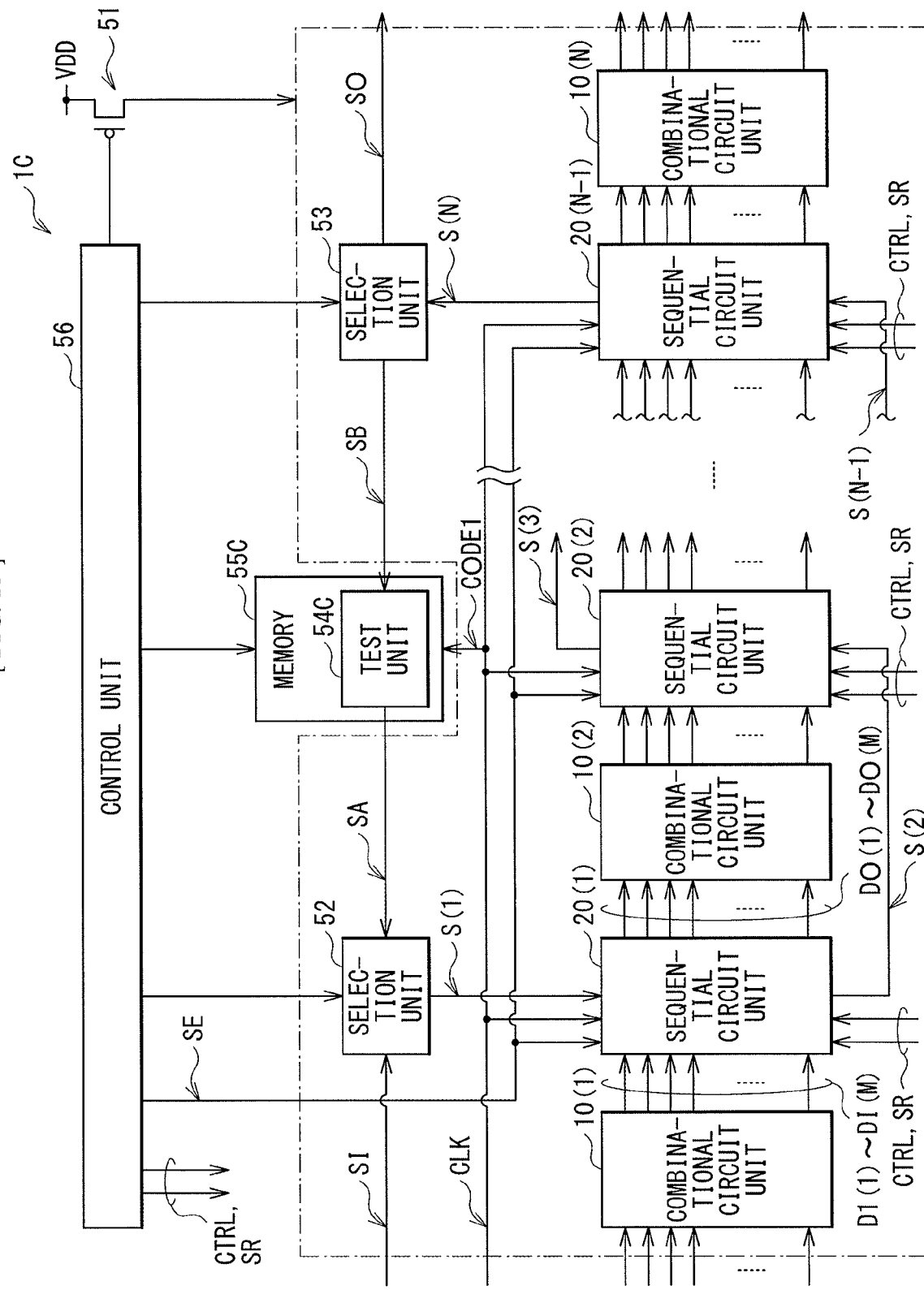

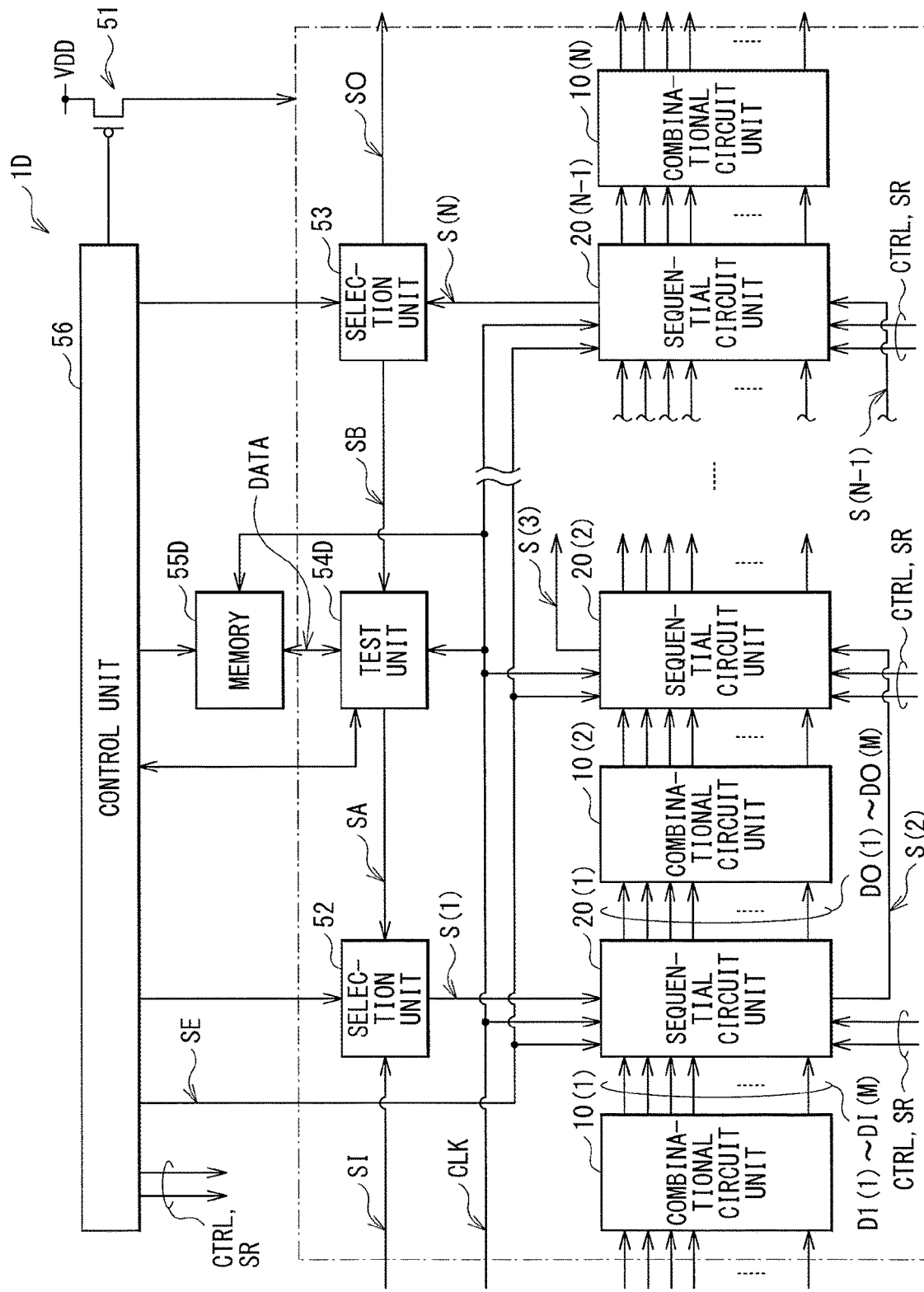
[FIG. 14]

[ FIG. 15 ]
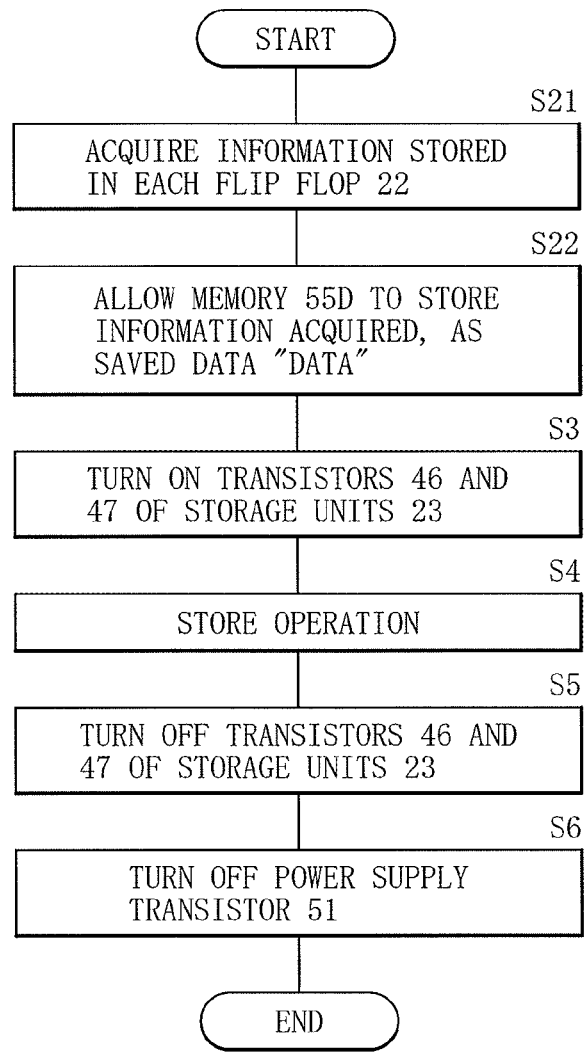

[ FIG. 16 ]
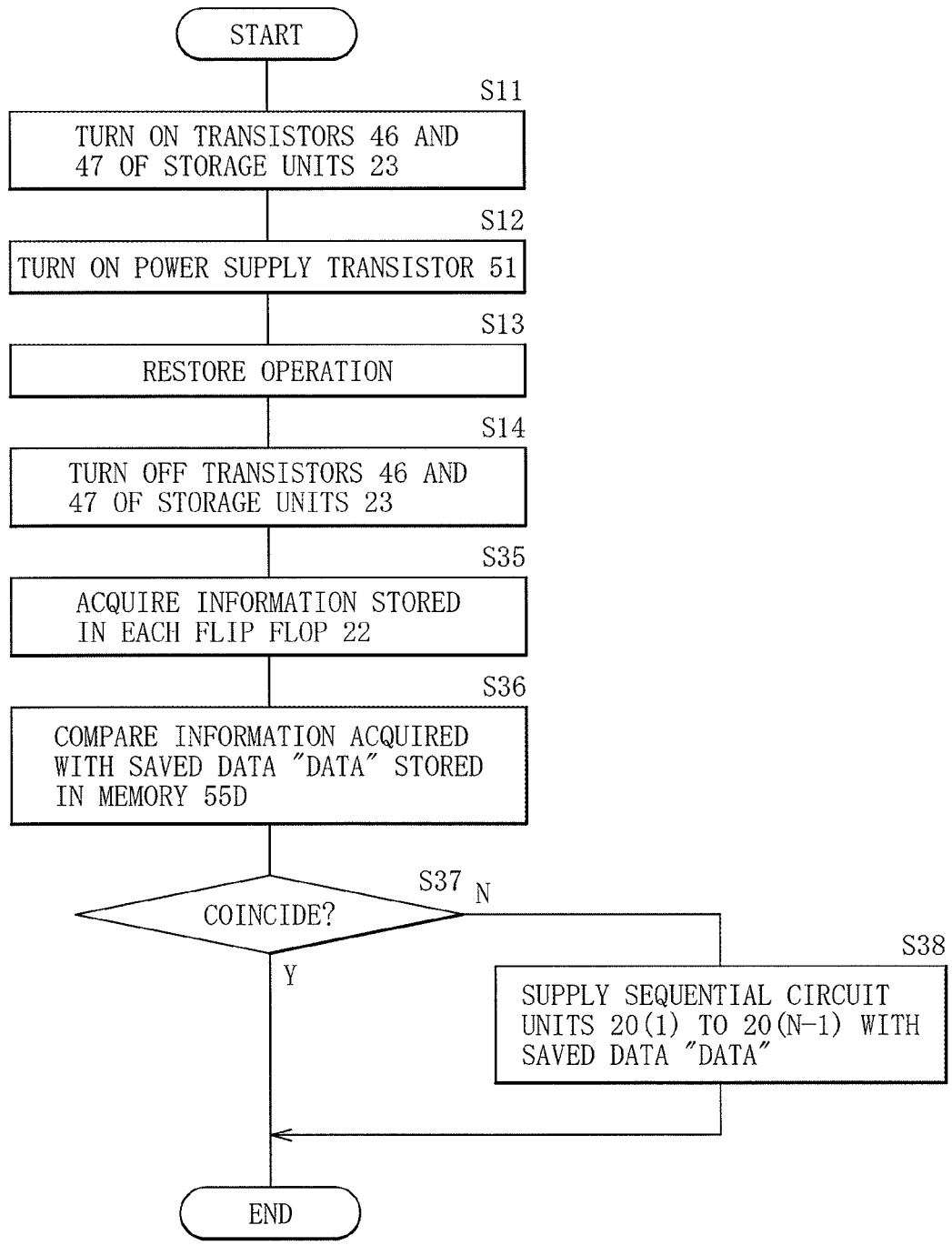

[ FIG. 17 ]
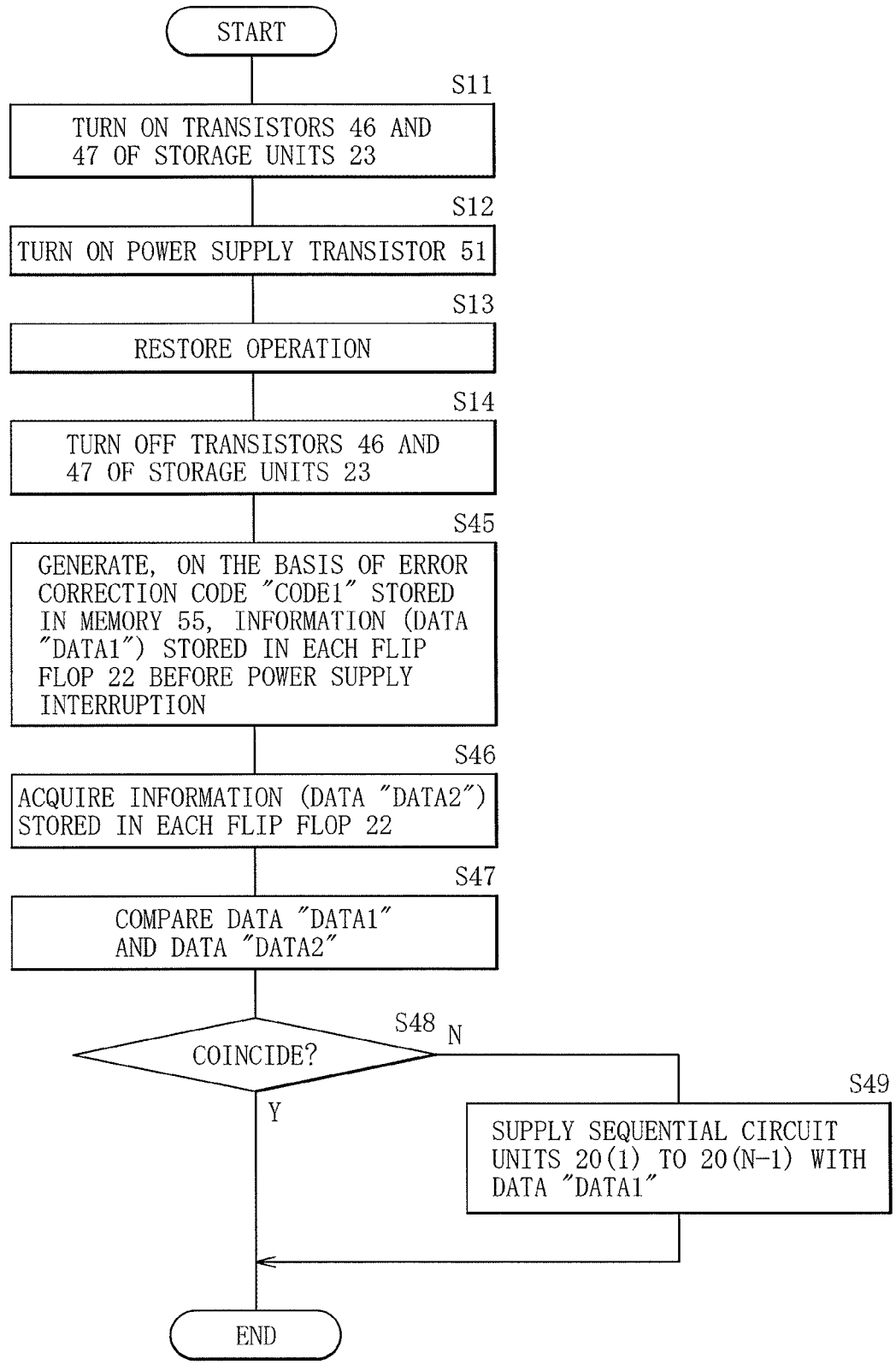

[ FIG. 18 ]
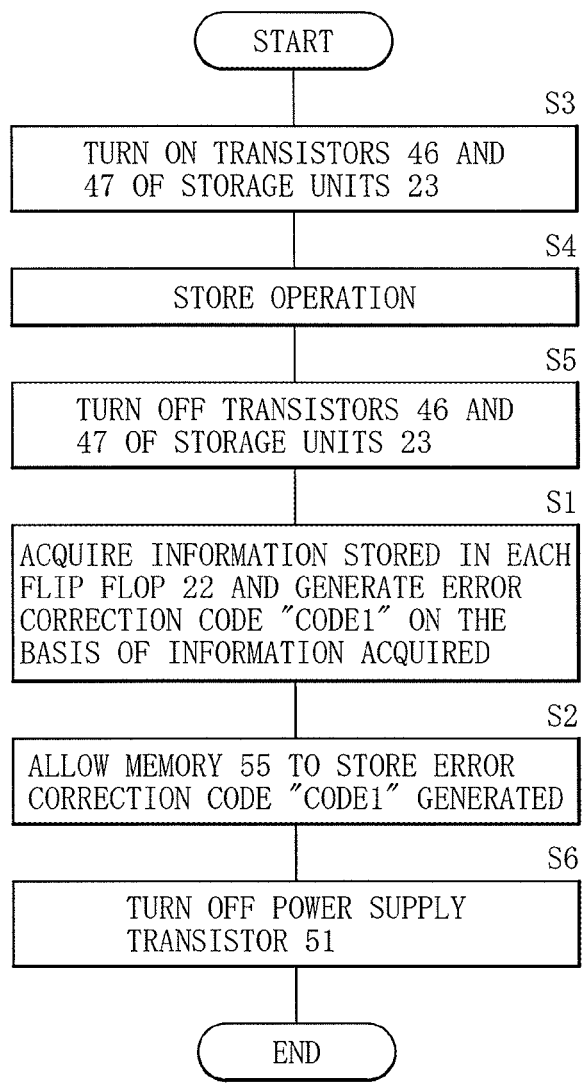

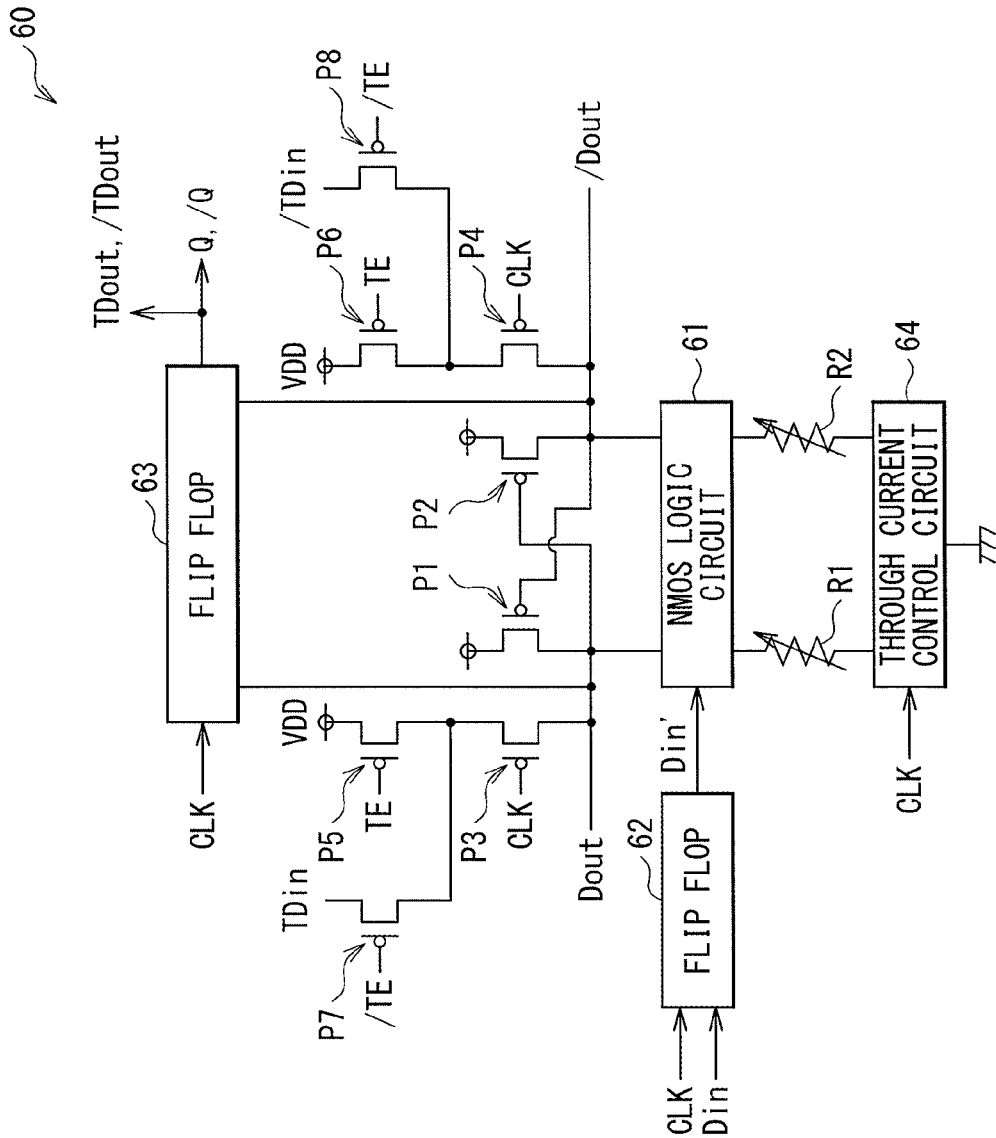
[FIG. 19]

[ FIG. 20 ]
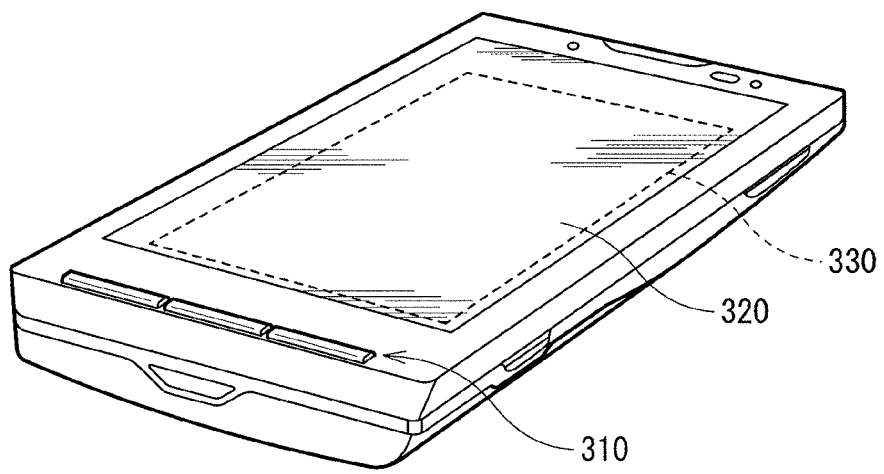

US 10,818,369 B2

SEMICONDUCTOR CIRCUIT, CONTROL METHOD OF SEMICONDUCTOR CIRCUIT, AND ELECTRONIC APPARATUS

CROSS REFERENCE TO RELATED APPLICATIONS

This application is a national stage application under 35 U.S.C. 371 and claims the benefit of PCT Application No. PCT/JP2017/030087 having an international filing date of 23 Aug. 2017, which designated the United States, which PCT application claimed the benefit of Japanese Patent Application No. 2016-195757 filed 3 Oct. 2016, the entire disclosures of each of which are incorporated herein by reference.

TECHNICAL FIELD

The disclosure relates to a semiconductor circuit including a non-volatile storage element, a control method of such a semiconductor circuit, and an electronic apparatus including such a semiconductor circuit.

BACKGROUND ART

For electronic apparatuses, low power consumption is desired from a viewpoint of ecology. In semiconductor circuits, often used is a so-called power gating technique that includes, for example, selective interruption of power supply to some of circuits in order to attain reduction in power consumption. For a circuit to which power supply is thus interrupted, desired is quick restoration, after a restart of the power supply, to an operation slate before the interruption of the power supply. One of methods of achieving such restore operation in a short lime is to incorporate a non-volatile storage element in the circuit (for example, PTL 1 and other documents).

CITATION LIST

Patent Literature

PTL 1: Japanese Unexamined Patent Application Publication No. 2012-242287

SUMMARY OF THE INVENTION

However, continuous rewriting over many years causes possibility of so-called aging deterioration in non-volatile storage elements. What is desired is, therefore, to make it possible to suppress influences on circuit operation even in a case with such aging deterioration.

It is desirable to provide a semiconductor circuit, a control method of a semiconductor circuit, and an electronic apparatus that make it possible to suppress influences on circuit operation even in a case with aging deterioration in a non-volatile storage element.

A semiconductor circuit according to an embodiment of the disclosure includes a sequential circuit unit and a first memory. The sequential circuit unit includes a plurality of logic circuit units that include respective flip flops and respective non-volatile storage elements. The sequential circuit unit performs, in a first term, store operation in which the storage elements in the plurality of the logic circuit units store respective voltage states in the plurality of the logic circuit units, and shift operation in which the flip flops in the plurality of the logic circuit units operate as a shift register. The first memory stores, in the first term, first data or second data, the first data being outputted from the shift register by the shift operation, and the second data corresponding to tire first data. The first memory stores, in the first term, first data or second data, the first data being outputted from the shift register by the shift operation, and the second data corresponding to the first data.

A control method of a semiconductor circuit according to an embodiment of the disclosure includes: allowing a sequential circuit unit including a plurality of logic circuit units that include respective flip flops and respective non-volatile storage elements to perform, in a first term, store operation in which the storage elements in the plurality of the logic circuit units store respective voltage states in the plurality of the logic circuit units, and shift operation in which the flip flops in the plurality of the logic circuit units operate as a shift register; and allowing a first memory to store, in the first term, first data or second data, the first data being outputted from the shift register by the shift operation, and the second data corresponding to the first data.

An electronic apparatus according to an embodiment of the disclosure includes a semiconductor circuit and a battery that supplies the semiconductor circuit with a power supply voltage. The semiconductor circuit includes a sequential circuit unit and a first memory. The sequential circuit unit includes a plurality of logic circuit units that include respective flip flops and respective non-volatile storage elements. The sequential circuit unit performs, in a first term, store operation in which the storage elements in the plurality of the logic circuit units store respective voltage stales in the plurality of the logic circuit units, and shift operation in which the flip flops in the plurality of the logic circuit units operate as a shift register. The first memory stores, in the first term, first data or second data, the first data being outputted from the shift register by the shift operation, and the second data corresponding to the first data. The first memory stores, in the first term, first data or second data, the first data being outputted from the shift register by the shift operation, and the second data corresponding to the first data.

In the semiconductor circuit, the control method of the semiconductor circuit, and the electronic apparatus according to the embodiments of the disclosure, in the first term, in the sequential circuit unit, performed are the store operation and the shift operation. In the store operation, by the storage elements in the plurality of the logic circuit units, stored are the respective voltage states in the plurality of the logic circuit units. In the shift operation, the flip flops in the plurality of the logic circuit units operate as the shift register. Moreover, the first data outputted from the shift register by the shift operation, or the second data corresponding to the first data is stored in the first memory.

According to the semiconductor circuit, the control method of the semi conductor circuit, and the electronic apparatus of the embodiments of the disclosure, the logic circuit units are provided with the respective non-volatile storage elements. The first data outputted from the shift register by the shift operation, or the second data is stored in the first memory. Hence, it is possible to suppress the influences on the circuit operation even in the case with the aging deterioration in the non-volatile storage element. It is to be noted that the effects described here are not necessarily limited, and any effect described in the present disclosure may be provided.

BRIEF DESCRIPTION OF DRAWING

FIG. 1 is a block diagram that illustrates one configuration example of a semiconductor circuit according to one embodiment of the disclosure.

FIG. 2 is a circuit diagram that illustrates one configuration example of a sequential circuit unit illustrated in FIG. 1.

FIG. 3 is a circuit diagram that illustrates one configuration example of a flip flop and a storage unit illustrated in FIG. 2.

FIG. 4 is a descriptive diagram that illustrates one example of normal operation of the semiconductor circuit illustrated in FIG. 1.

FIG. 5 is a descriptive diagram that illustrates one example of sleep mode operation of the semiconductor circuit illustrated in FIG. 1.

FIG. 6 is a descriptive diagram that illustrates one example of scan test operation of the semiconductor circuit illustrated in FIG. 1.

FIG. 7 is a flowchart that illustrates one example of preprocessing operation in the sleep mode operation.

FIG. 8A is a descriptive diagram that illustrates one example of store operation in the storage unit illustrated in FIG. 3.

FIG. 8B is another descriptive diagram that illustrates one example of the store operation in the storage unit illustrated in FIG. 3.

FIG. 9 is a flowchart that illustrates one example of postprocessing operation in the sleep mode operation.

FIG. 10 is a descriptive diagram that illustrates one example of restore operation in the storage unit illustrated in FIG. 3.

FIG. 11 is a block diagram that illustrates one configuration example of a semiconductor circuit according to a modification example.

FIG. 12 is a block diagram that illustrates one configuration example of a semiconductor circuit according to another modification example.

FIG. 13 is a block diagram that illustrates one configuration example of a semiconductor circuit according to another modification example.

FIG. 14 is a block diagram that illustrates one configuration example of a semiconductor circuit according to another modification example.

FIG. 15 is a flowchart that illustrates one example of preprocessing operation of the semiconductor circuit illustrated in FIG. 14.

FIG. 16 is a flowchart that illustrates one example of postprocessing operation of the semiconductor circuit illustrated in FIG. 14.

FIG. 17 is a flowchart that illustrates one example of postprocessing operation of a semiconductor circuit according to another modification example.

FIG. 18 is a flowchart that illustrates one example of preprocessing operation of a semiconductor circuit according to another modification example.

FIG. 19 is a circuit diagram that illustrates one configuration example of a sequential circuit unit in a semiconductor circuit according to another modification example.

FIG. 20 is a perspective view of an external appearance and a configuration of a smartphone to which the embodiment is applied.

MODES FOR CARRYING OUT THE INVENTION

In the following, some embodiments of the disclosure are described in detail with reference to the drawings. It is to be noted that description is made in the following order.

1. Embodiment
2. Application Example
1. Embodiment

Configuration Example

FIG. 1 illustrates one configuration example of a semiconductor circuit (semiconductor circuit 1) according to one embodiment. The semiconductor circuit 1 is configured to perform a so-called scan test to make it possible to attain easier evaluation. It is to be noted that a control method of a semiconductor circuit according to an embodiment of the disclosure is embodied by this embodiment, and is therefore described together.

The semiconductor circuit 1 includes a power supply transistor 51, N combinational circuit units 10 (combinational circuit units 10(1) to 10(N)), (N-1) sequential circuit units 20 (sequential circuit units 20(1) to 20(N-1)), selection units 52 and 53, a test unit 54, a memory 55, and a control unit 56.

The power supply transistor 51 is, in this example, a F type MOS (Metal Oxide Semiconductor) transistor, and includes a gate to be supplied with a control signal, a source to be supplied with a power supply voltage VDD, and a drain coupled to the N combinational circuit units 10, the (N-1) sequential circuit units 20, the selection units 52 and 53, and the test unit 54.

With this configuration, in the semiconductor circuit 1, it is possible to achieve steep mode operation. Specifically, in the sleep mode operation, the power supply transistor 51 is brought to an off state, to interrupt power supply to the N combinational circuit units 10, the (N-1) sequential circuit units 20, the selection units 52 and 53, and the test unit 54. Moreover, in normal operation, the power supply transistor 51 is brought to an on state, to supply the power supply voltage VDD to these circuits. In the semiconductor circuit 1, so-called power gating as mentioned above makes it possible to reduce power consumption.

The combinational circuit units 10 each include a so-called combinational circuit in which an output signal is univocally determined solely by a signal that is being currently inputted. In this example, the combinational circuit units 10 each generate a plurality of signals on the basis of a plurality of signals supplied. Specifically, for example, the combinational circuit unit 10(1) generates M signals DI(1) to DI(M) on tire basis of a plurality of signals supplied from outside of the semiconductor circuit 1, and supplies the signals DI(1) to DI(M) to the sequential circuit unit 20(1). Moreover, the combinational circuit unit 10(2) generates a plurality of signals on the basis of M signals DO(1) to DO(M) supplied from the sequential circuit unit 20(1), and supplies the plurality of the signals generated, to the sequential circuit unit 20(2). The same also applies to the combinational circuit units 10(3) to 10(N-1). Moreover, the combinational circuit unit 10(N) generates a plurality of signals on the basis of a plurality of signals supplied from the sequential circuit unit 20(N-1), and supplies the plurality of the signals generated, to the outside of the semiconductor circuit 1. In this way, in the semiconductor circuit 1, the combinational circuit units 10(1) to 10(N) and the sequential circuit units 20(1) to 20(N-1) are alternately disposed.

The sequential circuit units 20 each include a so-called sequential circuit that generates an output signal on the basis of not only a signal that is being currently inputted but also a signal that has been inputted before. The sequential circuit units 20 perform different kinds of operation in accordance with a scan enable signal SE.

Specifically, as described later, in a case where the scan enable signal SE is "0" (non-active), the sequential circuit units 20 each generate the plurality of the signals on the basis of the plurality of the signals supplied from the pre-stage combinational circuit unit 10 and on the basis of a clock signal CLK, and supplies the plurality of the signals generated, to the post-stage combinational circuit unit 10. Specifically, for example, the sequential circuit unit 20(1) generates the plurality of the signals DO(1) to DO(M) on the basis of the plurality of the signals DI(1) to DI(M) supplied from the pre-stage combinational circuit unit 10(1) and on the basis of the clock signal CLK, and supplies the plurality of the signals DO(1) to DO(M) to the post-stage combinational circuit unit 10(2). The sequential circuit unit 20(2) generates the plurality of the signals on the basis of the plurality of the signals supplied from the pre-stage combinational circuit unit 10(2) and on the basis of the clock signal CLK, and supplies the plurality of the signals generated, to the post-stage combinational circuit unit 10(3). The same also applies to the sequential circuit units 20(3) to 20(N-2). Moreover, the sequential circuit unit 20(N-1) generates the plurality of the signals on the basis of the plurality of the signals supplied from the pre-stage combinational circuit unit 10(N-1) and on the basis of the clock signal CLK, and supplies the plurality of the signals generated, to the post-stage combinational circuit unit 10(N).

Moreover, in a case where the scan enable signal SE is "1" (active), the sequential circuit units 20 perform scan shift operation. Specifically, for example, the sequential circuit unit 20(1) receives a signal S(1) supplied from the selection unit 52, while generating a signal S(2) by operating as a shift register, and supplies the signal S(2) to the post-stage sequential circuit unit 20(2). The sequential circuit unit 20(2) receives the signal S(2), while generating a signal S(3) by operating as a shift register and supplies the signal S(3) to the post-Stage sequential circuit unit 20(3). The same also applies to the sequential circuit units 20(3) to 20(N-2). Moreover, the sequential circuit unit 20(N-1) receives a signal S(N-1) supplied from the sequential circuit unit 20(N-2), while generating a signal S(N) by operating as a shift register, and supplies the signal S(N) to the selection unit 53.

FIG. 2 illustrates one configuration example of the sequential circuit unit 20(1). It is to be noted that the same also applies to the sequential circuit units 20(2) to 20(N-1). The sequential circuit unit 20(1) includes M selectors 21 (selectors 21(1) to 21(M)), M flip flops 22 (flip flops 22(1) to 22(M)), and the M storage units 23 (storage units 23(1) to 23(M)). The M selectors 21, the M flip flops 22, and the M storage units 23 are provided in corresponding relation to the M signals DI(I) to DI(M).

The selectors 21 each select, on the basis of the scan enable signal SE, one of a signal inputted to a first input terminal and a signal inputted to a second input terminal, and outputs the selected signal. Specifically, for example, the selector 21(1) selects, in the case where the scan enable signal SE is "0" (non-active), the signal DI(1) and outputs the selected signal as a signal D(1). The selector 21(1) selects, in the case where the scan enable signal SE is "1" (active), the signal S(1) and outputs the selected signal as the signal D(1). The selector 21(2) selects, in the case where the scan enable signal SE is "0" (non-active), the signal DI(2) and outputs the selected signal as a signal D(2). The selector 21(2) selects, in the case where the scan enable signal SE is "1" (active), the signal DO(1) and outputs the selected signal the signal D(2). The same also applies to the selectors 21(3) to 21(M-1). Moreover, the selector 21(M) selects, in the case where the scan enable signal SE is "0" (non-active), the signal DI(M) and outputs the selected signal as a signal D(M). The selector 21(M) selects, in the case where the scan enable signal SE is "1" (active), the signal DO(M-1) and outputs the selected signal as the signal D(M).

The flip flops 22 are each a D type flip flop. The flip flops 22 each perform, on the basis of a rising edge of the clock signal CLK, sampling of a signal inputted to a data input terminal D, and outputs a result of the sampling through a data output terminal Q. Specifically, the flip flop 22(1) performs, on the basis of the rising edge of the clock signal CLK, sampling of the output signal D(1) of the selector 21(1), and outputs a result of the sampling as the signal DO(1). The flip flop 22(2) performs, on the basis of the rising edge of the clock signal CLK, sampling of the output signal D(2) of the selector 21(2), and outputs a result of the sampling as the signal DO(2). The same also applies to the flip flops 22(3) to 22(M-1). Moreover, the flip flop 22(M) performs, on the basis of the rising edge of the clock signal CLK, sampling of the output signal D(M) of the selector 21(M), and outputs a result of the sampling as the signal DO(M), while outputting the result of the sampling as the signal S(2).

The storage units 23 are each a non-volatile storage unit, and each store a voltage state of the corresponding flip flop 22, on the basis of signals SR and CTRL. Specifically, on the basis of the signals SR and CTRL, the storage unit 23(1) stores a voltage slate of the flip flop 22(1) (store operation), or sets the voltage stale of the flip flop 22 on the basis of information stored (restore operation). The same also applies to the storage units 23(2) to 23(M).

FIG. 3 illustrates one configuration example of the flip flop 22(1) and the storage unit 23(1). It is to be noted that the same also applies to the flip flops 22(2) to 22(M) and the storage units 23(2) to 23(M). The flip flop 22(1) includes inverters 24 and 25, a master latch 30, and a slave latch 40. The storage unit 23(1) includes transistors 46 and 47, and storage elements 48 and 49.

The inverter 24 inverts the clock signal CLK to generate a clock signal CB. The inverter 25 inverts the clock signal CB to generate a clock signal C.

The master latch 30 includes an inverter 31, transmission gate 32, inverters 33 and 34, and a transmission gate 35. The inverter 31 includes an input terminal that is coupled to the data input terminal D of the flip flop 22(1) and is supplied with the signal D(1), and an output terminal coupled to one end of the transmission gate 32. The transmission gate 32 includes the one end coupled to the output terminal of the inverter 31, and another end coupled to a node N31. The transmission gate 32 is brought to an on state between the one end and the other end in a case where the clock signal C is at a low level, and is brought to an off state between the one end and the other end in a case where the clock signal C is at a high level. The inverter 53 includes an input terminal coupled to the node N31, and an output terminal coupled to a node N32. The inverter 34 includes an input terminal coupled to the node N32, and an output terminal coupled to one end of the transmission gate 35. The transmission gate 35 includes the one end coupled to the output terminal of the inverter 34, and another end coupled to the node N31. The transmission gate 35 is brought to an on state between the one end and the other end in the case where the clock signal C is at the high level, and is brought to an off state between the one end and the other end in the case where the clock signal C is at the low level.

The slave latch 40 includes a transmission gate 41, inverters 42 and 43, a transmission gale 44, and an inverter 45. The transmission gate 41 includes one end coupled to the node N32, and another end coupled to a node N41. The transmission gate 41 is brought to an on state between the one end and the other end in the case where the clock signal C is at the high level, and is brought to an off stale between the one end and the other end in the case where the clock signal C is at the low level. The inverter 42 includes an input terminal coupled to the node N41, and an output terminal coupled to a node N42. The inverter 43 includes an input terminal coupled to the node N42, and an output terminal coupled to one end of the transmission gate 44. The transmission gate 44 includes the one end coupled to the output terminal of the inverter 43, and another end coupled to the node N41. The transmission gate 44 is brought to an on state between the one end and the other end in the case where the clock signal C is at the low level and is brought to an off state between the one end and the oilier end in the case where the clock signal C is at the high level. The inverter 45 includes an input terminal coupled to the node N42, and an output terminal coupled to the data output terminal Q of the flip flop 22(1). The inverter 45 outputs the signal DO(1).

The transistors 46 and 47 are each, in this example, an N type MOS transistor. The transistor 46 includes a drain coupled to the node N41, a gate supplied with the signal SR, and a source coupled to one end of the storage element 48. The transistor 47 includes a drain coupled to the node N42, a gate supplied with the signal SR, and a source coupled to one end of the storage element 49.

The storage elements 48 and 49 are each a non-volatile storage element, and are each, in this example, a magnetic tunnel junction (MTJ) element of a spin transfer torque (STT) type in which spin injection causes a change in a direction of magnetization of a free layer F (described later) to store information. The storage element 48 includes the one end coupled to the source of the transistor 46, and another end supplied with the signal CTRL. The storage element 49 includes the one end coupled to the source of the transistor 47, and another end supplied with the signal CTRL.

In the following, description is given with the storage element 48 as an example. It is to be noted that the same also applies to the storage element 49. The storage element 48 includes a pinned layer P, a tunnel barrier layer I, and the free layer F. The pinned layer P includes a ferromagnetic body in which a direction of magnetization PJ is fixed at, for example, a direction perpendicular to a film surface. The free layer F includes a ferromagnetic body in which a direction of magnetization FJ changes in, for example, the direction perpendicular to the film surface, in accordance with a spin polarized current flowing therein. The tunnel barrier layer I breaks magnetic coupling of the pinned layer P and the free layer F, while functioning to allow a tunnel current to flow therethrough.

With this configuration, in the storage element 48, for example, a current flow from the free layer F to the pinned layer P causes polarized electrons to be injected from the pinned layer P to the free layer F. The polarized electrons have moment (spin) in the same direction as the magnetization PJ of the pinned layer P. Thus, the direction of the magnetization FJ of the free layer F is brought to the same direction as the direction of the magnetization PJ of the pinned layer P (parallel state). In the storage element 48, in the parallel state as mentioned above, a resistance value between both ends becomes low (low resistance state RL).

Moreover, for example, a current flow from the pinned layer P to the free layer F causes electrons to be injected from the free layer F to the pinned layer P. At this occasion, out of the injected electrons, polarized electrons having moment in the same direction as the magnetization PJ of the pinned layer P pass through the pinned layer P, while polarized electrons having moment in an opposite direction to the magnitization PJ of the pinned layer P are reflected from the pinned layer P and are injected to the free layer F. Thus, the direction of the magnetization FJ of the free layer F is brought to the opposite direction to the magnetization PJ of the pinned layer P (anti-parallel stale). In the storage element 48, in the anti-parallel state as mentioned above, the resistance value between both ends becomes high (high resistance state RH).

As described, in the storage elements 48 and 49, the direction of the magnetization FJ of the free layer F changes according to the direction of the current flow. This causes a resistance state to change between the high resistance state RH and the low resistance state RL. The storage elements 48 and 49 set the resistance state in this way, making it possible to store information.

As described, in the semiconductor circuit 1, the storage units 23 are provided in corresponding relation to the respective flip flops 22. Thus, for example, the storage units 23 perform, in the sleep mode operation, the store operation immediately before the interruption of the power supply, to store the voltage states of the flip flops 22. Moreover, the storage units 23 perform the restore operation after a restart of the power supply, to set the voltage states of the flip flops 22 on the basis of the information stored in the storage units 23. Thus, in the semiconductor circuit 1, it is possible to restore, after the restart of the power supply, in a short time, the voltage states of the respective flip flops 22 to the voltage slates before the interruption of the power supply.

The selection unit 52 (FIG. 1) selects, on the basis of a control signal supplied from the control unit 56, one of a signal SI and a signal SA, and outputs the selected signal as the signal S(1). The signal SI is supplied from the outside of the semiconductor circuit 1. The signal SA is supplied from the test unit 54.

The selection unit 53 supplies the signal S(N) to the test unit 54 as a signal SB, or outputs the signal S(N) to the outside of the semiconductor circuit 1 as a signal SO, on the basis of a control signal supplied from the control unit 56. The signal S(N) is supplied from the sequential circuit unit 20(N-1).

The test unit 54 restarts the power supply in the sleep mode operation, and after the storage units 23 in the respective sequential circuit units 20(1) to 20(N-1) performs the restore operation, carries out a test of the information stored in each of the flip flops 22. Specifically, as described later, firstly, before the interruption of the power supply, the test unit 54 acquires the information stored in each of the flip flops 22, and performs ECC (Error Correcting Code) processing on the basis of the information acquired, to generate an error correction code CODE1. Moreover, the test unit 54 allows the memory 55 to store the error correction code CODE1. Moreover, after the power supply is restarted and the storage units 23 each perform the restore operation, the test unit 54 acquires again the information stored in each of the flip flops 22, to generate an error correction code CODE2 on the basis of the information acquired. Moreover, the test unit 54 compares the error correction code CODE2 and the error correction code CODE1 that is stored in the memory 55, to carry out the test of the information stored in each of the flip flop 22. Moreover, in a case where the error correction code CODE2 is incoincident with the error correction code CODE1, the test unit 54 generates, on the basis of the error correction code CODE1, the information stored in each of the flip flops 22 before the interruption of the power supply, and supplies the information to each of the flip flops 22.

The memory 55 includes, in this example, an SRAM (Static Random Access Memory), and stores the error correction code CODE1 generated by the test unit 54. In this example, the memory 55 is configured to be supplied with the power supply voltage VDD even in a case where the power supply transistor 51 is brought to the off state. It is to be noted that in this example, the memory 55 includes the SRAM, bat this is non-limiting. Instead, the memory 55 may include a volatile memory such as a DRAM (Dynamic Random Access Memory). Alternatively, the memory 55 may include a non-volatile memory.

The control unit 56 controls operation of the sequential circuit units 20(1) to 20(N-1), the selection units 52 and 53, the test unit 54, the memory 55, and the power supply transistor 51. For example, the control unit 56 may include hardware, or alternatively, the control unit 56 may include a processor that is able to execute a program.

Here, the selectors 21, the nip flops 22, and the storage units 23 correspond one specific example of "logic circuit units" in the disclosure. The sequential circuit units 20 each correspond to one specific example of a "sequential circuit unit" in the disclosure. The combinational circuit units 10 each correspond to one specific example of a "first combinational circuit unit" and a "second combinational circuit unit" in the disclosure. The memory 55 corresponds to one specific example of a "first memory" in the disclosure. The error correction code CODE1 corresponds to one specific example of a "first error correction code" in the disclosure. The error correction code CODE2 corresponds to one specific example of a "second error correction code" in the disclosure.

Operation and Workings

Description is given next of operation and workings of the semiconductor circuit 1 of this embodiment.

Outline of Overall Operation

First, with reference to FIG. 1, described is an outline of overall operation of the semiconductor circuit 1. In the following, described are a case where normal operation OP1 is performed, a case where sleep mode operation OP2 is performed, and a case where a test (scan test operation OP3) after manufacture of the semiconductor circuit 1 is carried out.

FIG. 4 illustrates operation of the semiconductor circuit 1 in performing the normal operation OP1. In FIG. 4, major signals in the normal operation OP1 are denoted by thick lines. The combinational circuit unit 10(1) generates the M signals DI(1) to DI(M) on the basis of the plurality of the signals supplied from the outside of the semiconductor circuit 1. The sequential circuit unit 20(1) generates the plurality of the signals DO(1) to DO(M) on the basis of the plurality of the signals DI(1) to DI(M) supplied from the combinational circuit unit 10(1) and on the basis of the clock signal CLK. The combinational circuit unit 10(2) generates the plurality of the signals on the basis of the M signals DO(1) to DO(M) supplied from the sequential circuit unit 20(1). The same also applies to the combinational circuit units 10(3) to 10(N-1) and the sequential circuit units 20(2) to 20(N-2). The sequential circuit unit 20(N-1) generates the plurality of the signals on the basis of the plurality of the signals supplied from the combinational circuit unit 10(N-1) and on the basis of the clock signal CLK. Moreover, the combinational circuit unit 10(N) generates the plurality of the signals on the basis of the plurality of the signals supplied from the sequential circuit unit 20(N-1), and supplies the plurality of the signals generated, to the outside of the semiconductor circuit 1.

FIG. 5 illustrates operation of the semiconductor circuit 1 in performing the sleep mode operation OP2. In FIG. 5, major signals in the sleep mode operation OP2 are denoted by thick lines. In the sleep mode operation OP2, the semiconductor circuit 1 performs preprocessing operation OP21 before the interruption of the power supply, and thereafter, interrupts the power supply. Moreover, the semiconductor circuit 1 performs postprocessing operation OP22 after the restart of the power supply.

In the preprocessing operation OP21, first, the sequential circuit units 20(1) to 20(N-1) perform the scan shift operation. The selection unit S3 supplies the signal S(N) supplied from the sequential circuit unit 20(N-1), to the test unit 54 as the signal SB. The test unit 54 performs the ECC processing on the basis of the signal SB, to generate the error correction code CODE1, and allows the memory 55 to store the error correction code CODE1. Moreover, the storage units 23 of the respective sequential circuit units 20(1) to 20(N-1) perform the store operation, to store the voltage states of the corresponding flip flops 22. Moreover, the power supply transistor 51 is brought to the off state on the basis of the control signal from the control unit 56. This causes the interruption of the power supply to the N combinational circuit units 10, the (N-1) sequential circuit units 20, the selection units 52 and 53, and the test unit 54.

Moreover, in the postprocessing operation OP22, first, the power supply transistor 51 is brought to the on stale on the basis of the control signal from the control unit 56. This causes the restart of the power supply to the N combinational circuit units 10, the (N-1) sequential circuit units 20, the selection units 52 and 53, and the test unit 54. Moreover, in accompaniment with the restart of the power supply, the storage units 23 of the respective sequential circuit units 20(1) to 21(N-1) perform the restore operation, to set the voltage states of the corresponding flip flops 22 on the basis of the information stored in the storage units 23. Thereafter, the sequential circuit units 20(1) to 20(N-1) perform the scan shift operation. The selection unit S3 supplies the signal S(N) supplied from the sequential circuit unit 20(N-1), to the test unit 54 as the signal SB. The test unit 54 performs the ECC processing on the basis of the signal SB, to generate the error correction code CODE2, and compares the error correction code CODE2 and the error correction code CODE1 that is stored in the memory 55, to carry out the test of the information stored in each of the flip flops 22. Moreover, in the case where the error correction code CODE2 is incoincident with the error correction code CODE1, the test unit 54 generates, on the basis of the error correction code CODE1, the information stored in each of the flip flops 22 before the sleep mode operation, and outputs the resultant information as the signal SA. The selection unit 52 supplies the signal SA supplied from the test unit 54, to the sequential circuit unit 20(1) as the signal S(1). Moreover, the sequential circuit units 20(1) to 20(N-1) perform the scan shift operation.

FIG. 6 illustrates operation of the semiconductor circuit 1 in performing the scan test operation OP3. In FIG. 6, major signals in the scan test operation OP3 are denoted by thick lines. The selection unit 52 supplies the signal SI supplied from outside (e.g., a tester), to the sequential circuit unit 20(1) as the signal S(1). The sequential circuit units 20(1) to 20(N-1) perform the scan shift operation. Thus, information included in the signal supplied from the outside is set in the flip flops 22 of the respective sequential circuit units 20(1) to 20(N-1). Moreover, the semiconductor circuit 1 performs the normal operation OP1 (FIG. 4) while being supplied with the clock signal CLK by a single pulse from the outside. Thereafter, the sequential circuit units 20(1) to 20(N-1) perform the scan shift operation again. Moreover, the selection unit S3 supplies die signal S(N) supplied from the sequential circuit unit 20(N-1), to the outside (e.g., the tester) as the signal SO. In this way, the (ester sets input data of each of the combinational circuit units 10 while acquiring output data of each of the combinational circuit units 10. Moreover, the tester compares the output data with data to be expected. In the semiconductor circuit 1, as described, performing tests of the combinational circuit units 10(1) to 10(N) independently makes it possible to perform a test of the semiconductor circuit 1 effectively.

Regarding Sleep Mode Operation OP2

Described next are details of the preprocessing operation OP21 and the postprocessing operation OP22, in the sleep mode operation OP2.

FIG. 7 illustrates one example of the preprocessing operation OP21. In the preprocessing operation OP21, the test unit 54 generates the error correction code CODE1 on the basis of the information stored in each of the flip flops 22, and allows the memory 55 to store the error correction code CODE1, while the storage units 23 perform the store operation. In what follows, detailed description is given on this operation.

First, the test unit 54 acquires the information stored in each of the flip flops 22, and generates the error correction code CODE1 on the basis of the information acquired (step S1). Specifically, first, the sequential circuit units 20(1) to 20(N-1) perform the scan shift operation on the basis of the control signal supplied from the control unit 56. Moreover, the selection unit 53 supplies, on the basis of the control signal supplied from the control unit 56, the signal S(N) supplied from the sequential circuit unit 20(N-1), to the test unit 54 as the signal SB. Moreover, the test unit 54 performs the ECC processing on the basis of the signal SB, to generate the error correction code CODE1.

At this occasion, the test unit 54 outputs, as the signal SA, the signal SB as it is. Moreover, the selection unit 52 supplies, on the basis of the control signal supplied from the control unit 56, the signal SA to the sequential circuit unit 20(1) as the signal S(1). Moreover, the sequential circuit units 20(1) to 20(N-1) continue the scan shift operation until the information stored in each of the flip flops 22 becomes the same information as before a start of the scan shift operation.

Thereafter, the test unit 54 allows, on the basis of the control signal supplied from the control unit 56, the memory 55 to store the error correction code CODE1 generated in step S1 (step S2).

Thereafter, the control unit 56 brings the signal SR to a high level, to bring the transistors 46 and 47 in the storage units 23 in the respective sequential circuit units 20(1) to 20(N-1) to the on slate (step S3). This causes the storage units 23 to be electrically coupled to the respectively corresponding flip flops 22.

Thereafter, the storage units 23 in the respective sequential circuit units 20(1) to 20(N-1) perform the store operation (step S4).

FIGS. 8A and 8B illustrate one operation example of the slave latch 40 of the flip flop 22, and the storage unit 23, in the store operation. In FIGS. 8A and 8B, the transmission gates 41 and 44, and the transistors 46 and 47 are depicted as switches that denote their operation states.

In the store operation, the clock signal CLK is stopped, and is fixed at a low level. This brings the clock signal C to the low level, while bringing the clock signal SB to a high level. As a result, the transmission gate 41 is brought to the off state, while the transmission gate 44 is brought to the on state. Thus, in the slave latch 40, the inverter 42 inverts a voltage of the node N41, and outputs a result of the inversion to the node N42. The inverter 43 inverts a voltage of the node N42, and outputs a result of the inversion to the node N41 through the transmission gale 44. In other words, the slave latch 40 functions as a so-called bistable circuit.

First, the control unit 56 brings a voltage of the signal CTRL to a low level voltage VL (ground level) (FIG. 8A). This causes, in the storage units 23, a current to flow through one of the storage elements 48 and 49 in accordance with the information stored in the slave latch 40. In this example, a voltage VN41 of the node N41 is a high level voltage VH, while a voltage VN42 of the node N42 is the low level voltage VL. Accordingly, a store current Istore1 flows through the inverter 43, the transmission gale 44, the transistor 46, and the storage element 48 in this order. At this occasion, in the storage element 48, the store current Istore1 flows from the pinned layer P to the free layer F, bringing the direction of the magnetization FJ of the free layer F to the opposite direction to the direction of the magnetization PJ of the pinned layer P (anti-parallel state). As a result, the resistance state of the storage element 48 is brought to the high resistance state RH.

Thereafter, the control unit 56 brings the voltage of the signal CTRL to the high level voltage VH (FIG. 8B). This causes, in the storage units 23, a current to How through another of the storage elements 48 and 49 in accordance with the information stored in the slave latch 40. In this example, a store current Istore2 flows through the storage element 49, the transistor 47, the transmission gate 44, and the inverter 42 in this order. At this occasion, in the storage element 49, the store current Istore2 flows from the free layer F to the pinned layer P, bringing the direction of the magnetization FJ of the free layer F to the same direction as the direction of the magnetization PJ of the pinned layer P (parallel state). As a result, the resistance state of the storage element 49 is brought to the low resistance state RL.

As described, in the sequential circuit units 20(1) to 20(N-1), the respective storage units 23 store the voltage states of the corresponding flip flops 22.

Thereafter, the control unit 56 brings the signal SR to a low level, bringing the transistors 46 and 47 in the storage units 23 in the respective sequential circuit units 20(1) to 20(N-1) to the off state (step S5). Thus, the storage units 23 are electrically disconnected from the respectively corresponding flip flops 22.

Thereafter, the control unit 56 brings the power supply transistor 51 to the oil state (step S6). This causes the interruption of the power supply to the N combinational circuit units 10, the (N-1) sequential circuit units 20, the selection units 52 and 53, and the test unit 54. It is to be noted that the power supply to the memory 55 and the control unit 56 is maintained.

Thus, the preprocessing operation OP21 is ended. Moreover, the semiconductor circuit 1 performs the postprocessing operation OP22 after a lapse of time.

FIG. 9 illustrates one example of the postprocessing operation OP22. In the postprocessing operation OP22, the storage units 23 perform the restore operation, and thereafter, the test unit 54 carries out the test of the information stored in each of the flip flops 22. In what follows, detailed description is given on this operation.

First, the control unit 56 brings the signal SR to the high level, to bring the transistors 46 and 47 of the storage units 23 in the respective sequential circuit units 20(1) to 20(N-1) to the on state (step S11. This causes the storage units 23 to be electrically coupled to the respectively corresponding flip flops 22.

Thereafter, the control unit 56 brings the power supply transistor 51 to the on state (step S12). This causes the restart of the power supply to the N combinational circuit units 10, the (N-1) sequential circuit units 20, the selection units 52 and 53, and the test unit 54.

Moreover, in accompaniment with the restart of the power supply, the storage units 23 in the respective sequential circuit units 20(1) to 20(N-1) perform the restore operation (step S13).

FIG. 10 illustrates one operation example of the slave latch 40 of the flip flop 22, and the storage unit 23, in the restore operation. In the restore operation, as with the store operation, the clock signal CLK is stopped, and is fixed at the low level. This brings the transmission gate 41 to the off state, while bringing the transmission gate 44 to the on state. Moreover, the control unit 56 brings the voltage of the signal CTRL to the low level voltage VL (ground level).

Thus, the node N41 is grounded through the transistor 46 and the storage element 48, while the node N42 is grounded through the transistor 47 and the storage element 49. At this occasion, because the resistance states of the storage elements 48 and 49 differ from each other, a voltage state in the slave latch 40 is determined in accordance with the resistance states of the storage elements 48 and 49. In this example, the resistance state of the storage element 48 is the high resistance state RH, while the resistance state of the storage element 49 is the low resistance state RL. Accordingly, the node N41 is pulled down by the high resistance value, while the node N42 is pulled down by the low resistance value. Thus, the voltage VN41 of the node N41 is brought to the high level voltage VH, while the voltage VN42 of the node N42 is brought to the low level voltage VL.

In this way, in the sequential circuit units 20(1) to 20(N-1), the storage units 23 set the voltage states of the respectively corresponding flip flops 22 on the basis of the information stored.

Thereafter, the control unit 56 brings the signal SR to the low level, bringing the transistors 46 and 47 of the storage units 23 in the respective sequential circuit units 20(1) to 20(N-1) to the off state (step S14). This causes the storage units 23 to be electrically disconnected from the respectively corresponding flip flops 22.

Thereafter, the test unit 54 acquires the information stored in each of the flip flops 22, and generates the error correction code CODE2 on the basis of the information acquired (step S15). Specifically, first, the sequential circuit units 20(1) to 20(N-1) perform the scan shift operation on the basis of the control signal supplied from the control unit 56. Moreover, the selection unit 53 supplies, on the basis of the control signal supplied from the control unit 56, the signal S(N) supplied from the sequential circuit unit 20(N-1), to the test unit 54 as the signal SB. Moreover, the test unit 54 performs the ECC processing on the basis of the signal SB, to generate the error correction code CODE2.

At this occasion, the test unit 54 outputs, as the signal SA, the signal SB as it is. Moreover, the selection unit 52 supplies, on the basis of the control signal supplied from the control unit 56, the signal SA to the sequential circuit unit 20(1) as the signal S(1). Moreover, the sequential circuit units 20(1) to 20(N-1) continue the scan shift operation until the information stored in each of the flip flops 22 becomes the same information as before the start of the scan shift operation.

Thereafter, the test unit 54 compares the error correction code CODE2 generated in step S15, with the error correction code CODE1 stored in the memory 55 (step S16). Moreover, in a case where the error correction codes CODE1 and CODE2 are coincident ("Y" in step S17), the flow is ended.

Meanwhile, in a case where the error correction codes CODE1 and CODE2 are incoincident ("N" in step S17), the test unit 54 generates, on the basis of the error correction code CODE1, the information stored in each of the flip flops 22 before the interruption of the power supply, and supplies the information generated, to the sequential circuit units 20(1) to 20(N-1) (step S18). Specifically, the test unit 54 outputs the information generated, as the signal SA. Moreover, the selection unit 52 supplies, on the basis of the control signal supplied from the control unit 56, the signal SA supplied from the test unit 54, to the sequential circuit unit 20(1) as the signal S(1). Moreover, the sequential circuit units 20(1) to 20(N-1) perform the scan shift operation. Thus, the semiconductor circuit 1 sets the flip flops 22 of the respective sequential circuit units 20(1) to 20(N-1), on the basis of the information generated by the test unit 54.

Thus, the postprocessing operation OP22 is ended. After this, the semiconductor circuit 1 performs the normal operation OP1.

As described, in the semiconductor circuit 1, provided are the storage units 23 that store the voltage states of the respective flip flops 22. Hence, it is possible to restore the voltage states of the respective flip flops 22 to the voltage states before the interruption of the power supply, after the restart of the power supply, in a short time and with little energy. Specifically, for example, let us consider a case where no storage units 23 are provided and in the postprocessing operation OP22, the information stored in each of the flip flops 22 before the interruption of the power supply is generated on the basis of the error correction code CODE1 stored in the memory 55, and the information generated is supplied to the sequential circuit units 20(1) to 20(N-1). In this case, there is possibility that processing of restoring the voltage states of the respective flip flops 22 takes time and energy. Meanwhile, in the semiconductor circuit 1, provided are the storage units 23 that store the voltage states of the respective flip flops 22. Hence, it is possible to restore the voltage states of the respective flip flops 22 in a short time and with little energy.

Moreover, in the semiconductor circuit 1, in the postprocessing operation OP22, in the case where the error correction code CODE1 and the error correction code CODE2 are coincident, the normal operation OP1 is promptly performed. Hence, it is possible to start the normal operation OP1 after the restart of the power supply in a short time and with little energy.

Moreover, in the semiconductor circuit 1, after the power supply is restarted, and the storage units 23 in the respective sequential circuit units 20(1) to 20(N-1) perform the restore operation, the test of the information stored in each of the flip flops 22 is carried out. Hence, it is possible to suppress influences on circuit operation even in a case with aging deterioration in the storage elements 48 and 49 in the respective storage units 23. Specifically, in general, continuous rewriting over many years may cause possibility of the aging deterioration in non-volatile storage elements. In this case, for example, in spite of attempts to allow the storage elements to store information, there is possibility of a failure in allowing them to store information correctly. In the semiconductor circuit 1, the error correction code CODE1 is generated in the preprocessing operation OP21, while the error correction code CODE2 is generated in the postprocessing operation OP22. The error correction code CODE1 and the error correction code CODE2 are compared to carry out the test of the information stored in each of the flip flops 22. Thus, in the case where the error correction codes CODE1 and CODE2 are incoincident with each other, the test unit 54 determines that in the preprocessing operation OP21, the storage elements 48 and 49 has failed in storing the information correctly because of the aging deterioration. The test unit 54 generates, on the basis of the error correction code CODE1, the information stored in each of the flip flops 22 before the interruption of the power supply. Hence, in the semiconductor circuit 1, it is possible to suppress the influences on the circuit operation, even in the case with the aging deterioration in the storage elements 48 and 49.

Moreover, in the semiconductor circuit 1, in the preprocessing operation OP21, the test unit 54 acquires the information in each of the flip flops 22 to generate the error correction code CODE1 (step S1), and thereafter, the storage units 23 perform the store operation (step S4). Hence, it is possible to reduce possibility of erroneous circuit operation. Specifically, while the storage units 23 perform the store operation, as illustrated in FIGS. 8A and 8B, the store currents Istore1 and Istore 2 flow, in a case where current values of the store currents Istore1 and Istore2 are large, for example, the information stored in the slave latch 40 is lost, causing possibility of so-called disturbance. Accordingly, if the storage units 23 perform the store operation, and thereafter, the test unit 54 acquires the information in each of the flip flops 22 to generate the error correction code CODE1, there is possibility that the test unit 54 generates the error correction code CODE1 on the basis of incorrect information. Meanwhile, in the semiconductor circuit 1, the test unit 54 acquires the information in each of the flip flops 22 to generate the error correction code CODE1, and thereafter, the storage units 23 perform the store operation (step S4). Thus, even if disturbance occurs in the store operation, the error correction code CODE1 is kept from being influenced by the disturbance. Hence, it is possible to reduce the possibility of the erroneous circuit operation.

Moreover, in the semiconductor circuit 1, the error correction code CODE1 is stored in the memory 55. Hence, it is possible to reduce storage capacity of the memory 55, as compared to a case where the information stored in each of the flip flops 22 is stored in the memory 55 as it is.

Moreover, in the semiconductor circuit 1, the test of the information stored in each of the flip flops 22 is carried out in the sleep mode operation OP2, with the utilization of a system of the test (scan test operation OP3) after the manufacture of the semiconductor circuit 1. Hence, it is possible to carry out the test of the information stored in each of the flip flops 22, while simplifying a circuit configuration.

Effects

As described, in this embodiment, provided are the storage units that store the voltage states of the respective flip flops. Hence, it is possible to restore the voltage states of the respective flip flops to the voltage states before the interruption of the power supply, after the restart of the power supply, in a short time and with little energy.

In this embodiment, in the postprocessing operation, in the case where the error correction codes are coincident with each other, the normal operation is promptly performed. Hence, it is possible to start the normal operation after the restart of the power supply, in a short time and with little energy.

In this embodiment, the test of the information stored in each of the Hip flops is carried out, after the power supply is restarted, and the flip flops each perform the restore operation. Hence, it is possible to suppress the influences on the circuit operation even in the case with the aging deterioration in the storage elements.

In this embodiment, in the preprocessing operation, the test unit acquires the information in each of the flip flops to generate the error correction code CODE1, and thereafter, the storage units perform the store operation. Hence, it is possible to reduce the possibility of the erroneous circuit operation.

In this embodiment, the error correction code CODE1 is stored in the memory. Hence, it is possible to reduce the storage capacity of the memory.

Modification Example 1

In the forgoing embodiment, the drain of the power supply transistor 51 is coupled to the N combinational circuit units 10, the (N-1) sequential circuit units 20, the selection units 52 and 53, and the test unit 54. However, this is non-limiting. Instead, as in a semiconductor circuit 1A illustrated in FIG. 11, the drain of the power supply transistor 51 may be further coupled to a memory 55A. In this example, the memory 55A includes a non-volatile memory such as a magnetoresisttve memory (MRAM; Magnetoresistive Random Access Memory), a phase change memory (PCRAM; Phase Change Random Access Memory), and a resistance change type memory (ReRAM; Resistive Random Access Memory). The memory 55A is supplied with the power supply voltage VDD, by bringing the power supply transistor 51 to the on state. In the semiconductor circuit 1A, in the sleep mode operation, bringing the power supply transistor 51 to the off slate causes the interruption of the power supply to the memory 55A, in addition to the N combinational circuit units 10, the (N-1) sequential circuit units 20, the selection units 52 and 53, and the test unit 54. Hence, in the semiconductor circuit 1A, it is possible to reduce power consumption.

Moreover, as in a semiconductor circuit 1B illustrated in FIG. 12, a memory 57B and a control unit 56B may be provided. The memory 57B stores various kinds of information, and includes a non-volatile memory of the same kind as the memory 55A. The memory 57A is supplied with the power supply voltage VDD, by bringing the power supply transistor 51 to the on state. The control unit 56B controls operation of the semiconductor circuit 1B. Here, the memory 57B corresponds to one specific example of a "second memory" in the disclosure.

In the semiconductor circuit 1B, it is desirable that a size of a storage element of the memory 55A is larger than a size of a storage element of the memory 57B. Specifically, because the memory 55A stores the error correction code CODE1, a low writing error rate is desirable. By allowing the size of the storage element of the memory 55A to be larger than the size of the storage element of the memory 57B, reduction in the writing error rate is expected.

Modification Example 2

In the forgoing embodiment, the test unit 54 and the memory 55 are provided separately. However, this is non-limiting. Instead, for example, as in a semiconductor circuit 1C illustrated in FIG. 13, a test unit 54C may be provided inside a memory 55C. Specifically, in general, inside a memory, provided is a block that performs the ECC processing. Using such a memory as the memory 55C leads to a simplified configuration.

Modification Example 3

In the forgoing embodiment, the test unit 54 performs the ECC processing to generate the error correction codes CODE1 and CODE2. However, this is non-limiting. In what follows, described are details of a semiconductor circuit 1D according to this modification example.

FIG. 14 illustrates one configuration example of the semiconductor circuit 1D according to this modification example. The semiconductor circuit 1D includes a test unit 54D and a memory 55D. The test unit 54D allows, in the preprocessing operation OP21, the memory 55D to store the information acquired from each of the flip flops 22, as saved data DATA, and compares, in the postprocessing operation OP22, the information acquired from each of the flip flops 22 and the saved data DATA. The memory 55D stores the saved data DATA.

Described next are details of the preprocessing operation OP21 and the postprocessing operation OP22, in the sleep mode operation OP2 related to the semiconductor circuit 1D.

FIG. 15 illustrates one example of the preprocessing operation OP21. First, the test unit 54D acquires the information stored in each of the flip flops 22 (step S21). Specifically, first, the sequential circuit units 20(1) to 20(N-1) perform the scan shift operation, on the basis of the control signal supplied from the control unit 56. Moreover, the selection unit 53 supplies, on the basis of the control signal supplied from the control unit 56, the signal S(N) supplied from the sequential circuit unit 20(N-1), to the test unit 54D as the signal SB. Thereafter, the test unit 54D allows, on the basis of the control signal supplied from the control unit 56, the memory 55D to store the information acquired in step S21, as the saved data DATA (step S22). Moreover, the control unit 56 brings the transistors 46 and 47 of the storage units 23 in the respective sequential circuit units 20(1) to 20(N-1) to the on state (step S3). The storage units 23 each perform the store operation (step S4). The control unit 56 brings the transistors 46 and 47 of each of the storage units 23 to the off state (step S5). The control unit 56 brings the power supply transistor 51 to the off state (step S6).

FIG. 16 illustrates one example of the postprocessing operation OP22. First, the control unit 56 brings the transistors 46 and 47 of the storage units 23 in the respective sequential circuit units 20(1) to 20(N-1) to the on state (step S11), and brings the power supply transistor 51 to the on state (step S12). The storage units 23 each perform the restore operation (step S13). The control unit 56 brings the transistors 46 and 47 of each of the storage units 23 to the off state (step S14).

Thereafter, the test unit 54D acquires the information stored in each of the flip flops 22 (step S35). Specifically, first, the sequential circuit units 20(1) to 20(N-1) perform the scan shift operation on the basis of the control signal supplied from the control unit 56. Moreover, the selection unit 53 supplies, on the basis of the control signal supplied from the control unit 56, the signal S(N) supplied from the sequential circuit unit 20(N-1), to the test unit 54D as the signal SB.

Thereafter, the test unit 54D compares the information acquired in step S35 with the saved data DATA stored in the memory 55D (step S36). Moreover, in a case where the information acquired in step S35 and the saved data DATA are coincident ("Y" in step S37), the flow is ended.

Meanwhile, in a case where the information acquired in step S35 and the saved data DATA are incoincident ("N" in step S37), the test unit 54D supplies the saved data DATA to the sequential circuit units 20(1) to 20(N-1) (step S38). Specifically, the test unit 54D outputs the saved data DATA as the signal SA. Moreover, the selection unit 52 supplies, on the basis of the control signal supplied from the control unit 56, the signal SA supplied from the test unit 54D, to the sequential circuit unit 20(1) as the signal S(1). Moreover, the sequential circuit units 20(1) to 20(N-1) perform the scan shift operation. In this way, the semiconductor circuit 1D sets the flip flops 22 of the respective sequential circuit units 20(1) to 20(N-1), on the basis of the saved data DATA. Thus, the flow is ended.

As described, in the semiconductor circuit 1D, the test unit 54D keeps from performing the ECC processing. Hence, it is possible to simplify a configuration of the test unit 54D.

Modification Example 4

In the forgoing embodiment, the test unit 54 performs the ECC processing to generate the error correction codes CODE1 and CODE2, and compares the error correction codes CODE1 and CODE2. However, this is non-limiting. Described below are details of a semiconductor circuit 1E according to this modification example.

The semiconductor circuit 1E includes a test unit 54E. In the preprocessing operation OP21, the test unit 54E operates similarly to the case of the forgoing embodiment (FIG. 7). Meanwhile, in the postprocessing operation QP22, the test unit 54E generates, on the basis of the error correction code CODE1, the information stored in each of the flip flops 22 before the interruption of the power supply, and compares the information generated, and the information acquired from each of the flip flops 22.

FIG. 17 illustrates one example of the postprocessing operation OP22 related to the semiconductor circuit 1E. First, the control unit 56 brings the transistors 46 and 47 of the storage units 23 in the respective sequential circuit units 20(1) to 20(N-1) to the on state (step S11), and brings the power supply transistor 51 to the on state (step S12). The storage units 23 each perform the restore operation (step S13). The control unit 56 brings the transistors 46 and 47 of each of the storage units 23 to the off state (step S14).

Thereafter, the test unit 54E generates, on the basis of the error correction code CODE1 stored in the memory 55, the information stored in each of the flip flops 22 before the interruption of the power supply (data DATA1) (step S45).

Thereafter, the test unit 54E acquires the data stored in each of the flip flops 22 (data DATA2) (step S46). Specifically, first, the sequential circuit units 20(1) to 20(N-1) perform the scan shift operation on the basis of the control signal supplied from the control unit 56. Moreover, the selection unit 53 supplies, on the basis of the control signal supplied from the control unit 56, the signal S(N) supplied from the sequential circuit unit 20(N-1), to the test unit 54E as the signal SB.

Thereafter, the test unit 54E compares the data DATA1 generated in step S45 and the data acquired in step S46 (step S47). Moreover, in a case where the data DATA1 and the data DATA2 are coincident ("Y" in step S48), the flow is ended.

Meanwhile, in a case where the data DATA1 and the data DATA2 are incoincident ("N" in step S48), the test unit 54E supplies the data DATA1 to the sequential circuit units 20(1) to 20(N-1) (step S38). Thus, the flow is ended.

With this configuration as well, it is possible to produce similar effects to the case of the forgoing embodiment.

Modification Example 5

In the forgoing embodiment, in the preprocessing operation OP21, the test unit 54 acquires the information in each of the flip flops 22 to generate the error correction code CODE1, and thereafter, the storage units 23 perform the store operation. However, this is non-limiting. Instead, for example, in a case with a configuration in which disturbance is unlikely to occur in the store operation, as illustrated in FIG. 18, the storage units 23 may perform the store operation (step S4) and thereafter, the test unit 54 may acquire the information in each of the flip flops 22 to generate the error correction code CODE1 (step S1).

Modification Example 6

In the forgoing embodiment, the storage elements 48 and 49 include the magnetic tunnel junction elements of the spin transfer torque type. However, this is non-limiting. Any storage elements may be used insofar as they are able to store the voltage states of the flip flops 22. Specifically, for example, storage elements of a current drive type may be used, or alternatively, storage elements of a voltage drive type may be used. Examples applicable to the storage elements of the current drive type include storage elements used in the phase change random access memory (PCRAM) and storage elements used in the resistive random access memory (ReRAM) in addition to the MTJ elements. These storage elements may be of a unipolar type, or alternatively, the storage elements may be of a bipolar type. Examples applicable to the storage elements of the voltage drive type include storage elements used in a ferroelectric memory (FeRAM; Ferroelectric Random Access Memory) and a magnetic memory (MeRAM; Magnetoelectric Random Access Memory).

Modification Example 7

In the forgoing embodiment, as illustrated in FIG. 2, the sequential circuit units 20 include the flip flops 22, but this is non-limiting. Instead, the sequential circuit units may include various logic circuits. Specifically, for example, in FIG. 2, a set of circuitry including the selector 21, the flip flop 22, and the storage unit 23 may be replaced with a circuit described in PTL 1 (e.g., a logic circuit 60 illustrated in FIG. 19).

The logic circuit 60 includes an NMOS logic circuit 61, flip flops 62 and 63, a through current control circuit 64, non-volatile resistors R1 and R2, and transistors P1 to P8. Described below is corresponding relation in a case of replacement of the selector 21(1), the flip flop 22(1), and the storage unit 23(1) in the forgoing embodiment. A signal Din corresponds to, for example, the signal DI(1) to be inputted to the selector 21(1) illustrated in FIG. 2. Signals TDin and /TDin correspond to, for example, the signal S(1) to be inputted to the selector 21(1) illustrated in FIG. 2. A signal CUC corresponds to the clock signal CLK illustrated in FIG. 2. Signals TE and /TE correspond to the scan enable signal SB illustrated in FIG. 2. Signals Q, /Q, TDout, and /TDout correspond to the signal DO(1) illustrated in FIG. 2. Here, the logic circuit 60 corresponds to one specific example of a "logic circuit unit" in the disclosure.

In the normal operation OP1, on the basis of the signal Din, generated are the signals Dout, /Dout, Q, and /Q corresponding to a logic of the NMOS logic circuit 61. Moreover, in the sleep mode operation OP2 and the scan test operation OP3, the signals TDout and /TDout are generated on the basis of the signals TDin and /TDin.

With this configuration, the sequential circuit units 20 is able to perform various operations in accordance with the NMOS logic circuit 61, leading to higher degree of freedom of operation.

Other Modification Examples

Moreover, two or more of these modification examples may be combined.

2. Application Example

Description is given next of an application example of the semiconductor circuits described in the forgoing embodiment and the modification examples.

FIG. 20 illustrates an external appearance of a smartphone to which the semiconductor circuits according to the forgoing example embodiments are applied. The smartphone includes, for example, a main body 310, a display unit 320, and a battery 330.

The semiconductor circuits of the forgoing example embodiments are applicable to electronic apparatuses of various fields, e.g., a digital camera, a notebook personal computer, a portable game machine, and a video camera, in addition to the smartphone as mentioned above. In particular, the technology is effective for application to portable electronic apparatuses including batteries.

Although description has been made by giving the embodiment and the modification examples, and their specific applied examples and the application example to the electronic apparatus as mentioned above, the contents of the technology are not limited to the above-mentioned example embodiments and may be modified in a variety of ways.

For example, in the forgoing example embodiments, the power supply transistor 51 is provided and is turned on or off to control supply of the power supply voltage VDD. However, this is non-limiting. Instead, for example, a transistor may be provided on ground side and be turned on or off to control supply of a voltage VSS. In another alternative, for example, an internal circuit may be provided with a regulator circuit that supplies a power supply voltage. The supply of the power supply voltage may be controlled by turning on or off operation of the regulator circuit.

It is to be noted that the effects described in this specification are mere examples and non-limiting, and there may be other effects.

It is to be noted that the technology may have the following configurations.

(1) A semiconductor circuit, including:

a sequential circuit unit including a plurality of logic circuit units that include respective flip flops and respective non-volatile storage elements, the sequential circuit unit performing, in a first term, store operation in which the storage elements in the plurality of the logic circuit units store respective voltage states in the plurality of the logic circuit units, and shift operation in which the flip flops in the plurality of the logic circuit units operate as a shift register; and a first memory that stores, in the first term, first data or second data, the first data being outputted from the shift register by the shift operation, and the second data corresponding to the first data.

(2) The semiconductor circuit according to (1), further including a test unit, in which the sequential circuit unit performs, in a second term after the first term, restore operation and the shift operation in order, the restore operation including setting the voltage states of the plurality of the logic circuit units on the basis of information stored in the storage elements in the plurality of the logic circuit units, and the test unit carries out, in the second term, on the basis of the first data or the second data, a test of third data outputted from the shift register by the shift operation, the first data or the second data being stored in the first memory.

(3) The semiconductor circuit according to (2), in which the test unit generates, in the second term, fourth data on the basis of a result of the test of the third data, and supplies the fourth data to the shift register, and the sequential circuit unit performs, in the second term, the shift operation to set the fourth data at initial data of the flip flops in the plurality of the logic circuit units.

(4) The semiconductor circuit according to (2) or (3), further including.

a first combinational circuit that supplies fifth data to the sequential circuit unit; and a second combinational circuit that operates on the basis of sixth data, in which the sequential circuit unit performs, in a third term after the second term, processing operation that includes generating the sixth data on the basis of the fifth data.

(5) The semiconductor circuit according to (3) or (4), in which the first memory stores the second data.

the test unit generates, in the first term, a first error correction code on the basis of the first data, and the second data is the first error correction code.

(6) The semiconductor circuit according to (5), in which the test unit obtains, in the second term, a second error correction code on the basis of the third data, and compares the first error correction code and the second error correction code to carry out the test of the third data.

(7) The semiconductor circuit according to (6), in which the test unit generates the fourth data on the basis of the first error correction code, on the condition that the first error correction code and the second error correction code are incoincident.

(8) The semiconductor circuit according to (5), in which in the second term, the test unit generates the first data on the basis of the first error correction code, and compares the first data and the third data to carry out the test of the third data.

(9) The semiconductor circuit according to (8), in which the test unit supplies, as the fourth data, the first data to the shift register, on the condition that the first data and the third data are incoincident.

(10) The semiconductor circuit according to (3) or (4), in which the first memory stores the first data, and the test unit compares, in the second term, the third data and the first data to carry out the test of the third data, the first data being stored in the first memory.

(11) The semiconductor circuit according to (10), in which the test unit supplies, as the fourth data, the first data to the shift register, on the condition that the third data and the first data are incoincident, the first data being stored in the first memory.

(12) The semiconductor circuit according to any one of (2) to (11), further including a control unit that performs a power supply control, to perform, in the first term and the second term, power supply to the sequential circuit unit, and to interrupt in a fourth term between the first term and the second term, the power supply to the sequential circuit unit.

(13) The semiconductor circuit according to any one of (1) to (12), in which in the first term, the sequential circuit unit performs the store operation after performing the shift operation.

(14) The semiconductor circuit according to any one of (1) to (12), in which in the first term, the sequential circuit unit performs the shift operation after performing the store operation.

(15) The semiconductor circuit according to any one of (1) to (14), in which the flip flops each include a master latch and a slave latch, and the storage elements are each configured to be connectable to the slave latch.

(16) The semiconductor circuit according to (15), in which the slave latch includes a first circuit configured to generate, on the basis of a voltage at a first node, an inverted voltage of the relevant voltage, and to be able to apply the inverted voltage to a second node, and a second circuit configured to generate, on the basis of a voltage at the second node, an inverted voltage of the relevant voltage, and to be able to apply the inverted voltage to the first node, and the storage elements each include a first storage element and a second storage element, the first storage element being configured to be connectable to the first node, and the second storage element being configured to be connectable to the second node.

(17) The semiconductor circuit according to any one of (1) to (16), in which the storage elements each store information on the basis of a current to be applied.

(18) The semiconductor circuit according to (17), in which the storage elements are each an element of a unipolar type or a bipolar type.

(19) The semiconductor circuit according to any one of (1) to (16), in which the storage elements each store information on the basis of a voltage to be applied.

(20) The semiconductor circuit according to any one of (1) to (19), further including a second memory including a storage element of a same kind as a storage element of the first memory, in which a size of the storage element of the first memory is larger than a size of the storage element of the second memory.

(21) A control method of a semiconductor circuit, the control method including:

allowing a sequential circuit unit including a plurality of logic circuit units that include respective flip flops and respective non-volatile storage elements to perform, in a first term, store operation in which the Storage elements in the plurality of the logic circuit units store respective voltage states in the plurality of the logic circuit units, and shift operation in which the flip flops in the plurality of the logic circuit units operate as a shift register; and allowing a first memory to store, in the first term, first data or second data, the first data being outputted from the shift register by the shift operation, and the second data corresponding to the first data.

(22) The control method of the semiconductor circuit according to (21), further including:

allowing the sequential circuit unit to perform, in a second term after the first term, restore operation and the shift operation in order, the restore operation including setting the voltage slates of the plurality of the logic circuit units on the basis of information stored in the storage elements in the plurality of the logic circuit units, and allowing a test unit to carry out, in the second term, on the basis of data stored in the first memory, a test of third data outputted from the shift register by the shift operation.

(23) An electronic apparatus including:

a semiconductor circuit; and a battery that supplies the semiconductor circuit with a power supply voltage, the semiconductor circuit including a sequential circuit unit including a plurality of logic circuit units that include respective flip flops and respective non-volatile storage elements, the sequential circuit unit performing, in a first term, store operation in which the storage elements in the plurality of the logic circuit units store respective voltage states in the plurality of the logic circuit units, and shift operation in which the flip flops in the plurality of the logic circuit units operate as a shift register, and a first memory that stores, in the first term, first data or second data, the first data being outputted from the shift register by the shift operation, and the second data corresponding to the first data.

This application claims the benefit of Japanese Priority Patent Application JP2016-195757 filed with the Japan Patent Office on Oct. 3, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor circuit, comprising:
a sequential circuit unit including a plurality of logic circuit units that include respective flip flops and respective non-volatile storage elements, the sequential circuit unit performing, in a first term, a store operation in which the storage elements in the plurality of the logic circuit units store respective voltage states in the plurality of the logic circuit units, and a shift operation in which the flip flops in the plurality of the logic circuit units operate as a shift register;
a first memory that stores, in the first term, first data or second data, the first data being outputted from the shift register by the shift operation, and the second data corresponding to the first data; and
a test unit,
wherein the sequential circuit unit performs, in a second term after the first term, a restore operation and the shift operation in order, the restore operation including setting the voltage states of the plurality of the logic circuit units on a basis of information stored in the storage elements in the plurality of the logic circuit units, and the test unit carries out, in the second term, on a basis of the first data or the second data, a test of third data outputted from the shift register by the shift operation, the first data or the second data being stored in the first memory.

2. The semiconductor circuit according to claim 1, wherein
the test unit generates, in the second term, fourth data on a basis of a result of the test of the third data, and supplies the fourth data to the shift register, and
the sequential circuit unit performs, in the second term, the shift operation to set the fourth data at initial data of the flip flops in the plurality of the logic circuit units.

3. The semiconductor circuit according to claim 2, further comprising:
a first combinational circuit that supplies fifth data to the sequential circuit unit; and
a second combinational circuit that operates on a basis of sixth data,
wherein the sequential circuit unit performs, in a third term after the second term, processing operation that includes generating the sixth data on a basis of the fifth data.

4. The semiconductor circuit according to claim 2, wherein
the first memory stores the second data,
the test unit generates, in the first term, a first error correction code on a basis of the first data, and
the second data is the first error correction code.

5. The semiconductor circuit according to claim 4, wherein the test unit obtains, in the second term, a second error correction code on a basis of the third data, and compares the first error correction code and the second error correction code to carry out the test of the third data.

6. The semiconductor circuit according to claim 5, wherein the test unit generates the fourth data on a basis of the first error correction code, on a condition that the first error correction code and the second error correction code are incoincident.

7. The semiconductor circuit according to claim 4, wherein in the second term, the test unit generates the first data on the basis of the first error correction code, and compares the first data and the third data to carry out the test of the third data.

8. The semiconductor circuit according to claim 7, wherein the test unit supplies, as the fourth data, the first data to the shift register, on a condition that the first data and the third data are incoincident.

9. The semiconductor circuit according to claim 2, wherein
the first memory stores the first data, and
the test unit compares, in the second term, the third data and the first data to carry out the test of the third data, the first data being stored in the first memory.

10. The semiconductor circuit according to claim 9, wherein the test unit supplies, as the fourth data, the first data to the shift register, on a condition that the third data and the first data are incoincident, the first data being stored in the first memory.

11. The semiconductor circuit according to claim 1, further comprising a control unit that performs a power supply control, to perform, in the first term and the second term, power supply to the sequential circuit unit, and to interrupt, in a fourth term between the first term and the second term, the power supply to the sequential circuit unit.

12. The semiconductor circuit according to claim 1, wherein in the first term, the sequential circuit unit performs the store operation after performing the shift operation.

13. The semiconductor circuit according to claim 1, wherein in the first term, the sequential circuit unit performs the shift operation after performing the store operation.

14. The semiconductor circuit according to claim 1, wherein
the flip flops each include a master latch and a slave latch, and
the storage elements are each configured to be connectable to the slave latch.

15. The semiconductor circuit according to claim 14, wherein
the slave latch includes
a first circuit configured to generate, on a basis of a voltage at a first node, an inverted voltage of the relevant voltage, and to be able to apply the inverted voltage to a second node, and
a second circuit configured to generate, on a basis of a voltage at the second node, an inverted voltage of the relevant voltage, and to be able to apply the inverted voltage to the first node, and
the storage elements each include a first storage element and a second storage element, the first storage element being configured to be connectable to the first node, and the second storage element being configured to be connectable to the second node.

16. The semiconductor circuit according to claim 1, wherein the storage elements each store information on a basis of a current to be applied.

17. The semiconductor circuit according to claim 16, wherein the storage elements are each an element of a unipolar type or a bipolar type.

18. The semiconductor circuit according to claim 1, wherein the storage elements each store information on a basis of a voltage to be applied.

19. The semiconductor circuit according to claim 1, further comprising a second memory including a storage element of a same kind as a storage element of the first memory,
wherein a size of the storage element of the first memory is larger than a size of the storage element of the second memory.

20. A control method of a semiconductor circuit, the control method comprising:
allowing a sequential circuit unit including a plurality of logic circuit units that include respective flip flops and respective non-volatile storage elements to perform, in a first term, a store operation in which the storage elements in the plurality of the logic circuit units store respective voltage states in the plurality of the logic circuit units, and a shift operation in which the flip flops in the plurality of the logic circuit units operate as a shift register; and
allowing a first memory to store, in the first term, first data or second data, the first data being outputted from the shift register by the shift operation, and the second data corresponding to the first data;
allowing the sequential circuit unit to perform, in a second term after the first term, a restore operation and the shift operation in order, the restore operation including setting the voltage states of the plurality of the logic circuit units on a basis of information stored in the storage elements in the plurality of the logic circuit units; and
allowing a test unit to carry out, in the second term, on a basis of data stored in the first memory, a test of third data outputted from the shift register by the shift operation.

21. An electronic apparatus comprising:
a semiconductor circuit; and
a battery that supplies the semiconductor circuit with a power supply voltage,
the semiconductor circuit including
a sequential circuit unit including a plurality of logic circuit units that include respective flip flops and respective non-volatile storage elements, the sequential circuit unit performing, in a first term, a store operation in which the storage elements in the plurality of the logic circuit units store respective voltage states in the plurality of the logic circuit units, and a shift operation in which the flip flops in the plurality of the logic circuit units operate as a shift register,
a first memory that stores, in the first term, first data or second data, the first data being outputted from the shift register by the shift operation, and the second data corresponding to the first data, and
a test unit,
wherein the sequential circuit unit performs, in a second term after the first term, a restore operation and the shift operation in order, the restore operation including setting the voltage states of the plurality of the logic circuit units on a basis of information stored in the storage elements in the plurality of the logic circuit units, and
the test unit carries out, in the second term, on a basis of the first data or the second data, a test of third data outputted from the shift register by the shift operation, the first data or the second data being stored in the first memory.

* * * * *